(12) United States Patent
Ahn et al.

(10) Patent No.: US 10,892,443 B2
(45) Date of Patent: Jan. 12, 2021

(54) DISPLAY DEVICE HAVING A THIN FILM GLASS LAYER

(71) Applicant: SAMSUNG DISPLAY CO., LTD., Yongin-si (KR)

(72) Inventors: Hung Kun Ahn, Seongnam-si (KR); Youngsang Park, Seoul (KR); Sungguk An, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/567,649

(22) Filed: Sep. 11, 2019

(65) Prior Publication Data

US 2020/0194724 A1 Jun. 18, 2020

(30) Foreign Application Priority Data

Dec. 12, 2018 (KR) .......................... 10-2018-0160268

(51) Int. Cl.
*H01L 51/52* (2006.01)
*H01L 51/00* (2006.01)

(52) U.S. Cl.
CPC ...... *H01L 51/5256* (2013.01); *H01L 51/0097* (2013.01); *H01L 51/5246* (2013.01); *H01L 51/5284* (2013.01)

(58) Field of Classification Search
CPC ............. H01L 51/5256; H01L 51/0097; H01L 51/5246; H01L 51/5284
See application file for complete search history.

(56) References Cited

U.S. PATENT DOCUMENTS

| | | | |
|---|---|---|---|
| 9,611,358 B2 * | 4/2017 | Jeong | B32B 27/281 |
| 9,865,844 B1 | 1/2018 | Park et al. | |
| 10,067,528 B2 * | 9/2018 | Lee | G06F 1/1616 |
| 10,216,020 B2 * | 2/2019 | Lim | H04M 1/0268 |
| 10,278,390 B2 * | 5/2019 | Rolfe | A01N 25/10 |
| 2014/0355227 A1 * | 12/2014 | Lim | H04M 1/0268 |
| | | | 361/749 |
| 2015/0232621 A1 * | 8/2015 | Jeong | B32B 27/286 |
| | | | 257/40 |
| 2017/0064879 A1 * | 3/2017 | Lee | G06F 1/16 |
| 2017/0354143 A1 * | 12/2017 | Rolfe | A01N 25/28 |
| 2018/0123083 A1 | 5/2018 | Im et al. | |
| 2018/0196189 A1 | 7/2018 | Choi et al. | |
| 2020/0097044 A1 * | 3/2020 | Kim | G06F 1/1607 |

FOREIGN PATENT DOCUMENTS

| | | |
|---|---|---|
| KR | 1020180002114 | 1/2018 |
| KR | 1020180025866 | 3/2018 |
| KR | 1020180034735 | 4/2018 |
| KR | 1020180046424 | 5/2018 |

* cited by examiner

*Primary Examiner* — Nikolay K Yushin
(74) *Attorney, Agent, or Firm* — F. Chau & Associates, LLC

(57) ABSTRACT

Provided is a display device. The display device includes a flexible display panel configured to display an image, and a window disposed on a display surface of the flexible display panel. The window includes a first protection layer, a thin film glass layer disposed on the first protection layer, and a second protective layer disposed on the thin film glass layer.

20 Claims, 19 Drawing Sheets ical field

The present disclosure relates to a display device, and more particularly, to a display device having a thin film glass layer.

DISCUSSION OF THE RELATED ART

Electronic devices such as smart phones, tablet computers, notebook computers, and smart televisions are under development. These electronic devices generally include a display module for displaying information and imagery to a user. Electronic devices may further include various other electronic modules in addition to the display module.

Recently, display devices have been developed to be capable of folding or rolling without breaking. These flexible display devices incorporate a bending flexible display member. Unlike traditional flat panel display devices, flexible display devices may be folded or rolled like paper. Flexible display devices may be easy to carry as they may be folded or rolled into a more convenient shape.

SUMMARY

The present disclosure provides a display device having increased impact resistance.

An embodiment of the present inventive concept provides a display device including a flexible display panel configured to display an image. A window is disposed on a display surface of the flexible display panel. The window includes a first protection layer, a thin film glass layer disposed on the first protection layer, and a second protective layer disposed on the thin film glass layer.

In an embodiment of the present inventive concept, the second protection layer may include a hard coating layer.

In an embodiment of the present inventive concept, the window may further include a fingerprint prevention layer disposed on the second protection layer.

In an embodiment of the present inventive concept, the first protection layer may include a first shock absorption layer.

In an embodiment of the present inventive concept, the first protective layer may further include an internal adhesive layer adhering the first shock absorption layer to the rear surface of the thin film glass.

In an embodiment of the present inventive concept, the second protection layer may include a hard coating layer. A second shock absorption layer is disposed between the hard coating layer and the thin film glass layer.

In an embodiment of the present inventive concept, the thin film glass layer may have a thickness within a range of 30 μm to 70 μm.

In an embodiment of the present inventive concept, the flexible display panel may include an organic light emitting display panel including an organic light emitting element.

In an embodiment of the present inventive concept, a display device includes a display panel configured to display an image. The display panel includes a folding area that folds around a folding axis, and a plurality of non-folding areas that are adjacent to opposite sides of the folding area. A window is disposed on the display surface of the display panel. The window includes a first protection layer, a thin film glass layer disposed on the first protection layer, and a second protective layer disposed on the thin film glass layer.

In an embodiment of the present inventive concept, the display panel may be folded out such that the display surface is exposed to the outside or may be folded in so as to face the display surface.

In an embodiment of the present inventive concept, the second protection layer may include a hard coating layer.

In an embodiment of the present inventive concept, the hard coating layer may have a thickness within a range of 3 μm to 30 μm.

In an embodiment of the present inventive concept, the hard coating layer may include a urethane resin, an epoxy resin, an acrylic resin, and/or an acrylate resin.

In an embodiment of the present inventive concept, the hard coating layer may have an indentation hardness within a range of 15 HV to 40 HV.

In an embodiment of the present inventive concept, the window may further include a fingerprint prevention layer disposed on the second protection layer.

In an embodiment of the present inventive concept, the first protection layer may include a first shock absorption layer.

In an embodiment of the present inventive concept, the first shock absorption layer may have a thickness within a range of 10 μm to 60 μm.

In an embodiment of the present inventive concept, the first protective layer may further include an internal adhesive layer adhering the first shock absorption layer to the rear surface of the thin film glass layer.

In an embodiment of the present inventive concept, the internal adhesive layer may have a thickness within a range of 10 μm to 70 μm.

In an embodiment of the present inventive concept, the second protection layer may include a hard coating layer and a second shock absorption layer disposed between the thin film glass layer and the hard coating layer.

In an embodiment of the present inventive concept, the second shock absorption layer may have a thickness within a range of 5 μm to 50 μm.

In an embodiment of the present inventive concept, the second shock absorption layer may include a urethane resin, an epoxy resin, a polyimide resin, a polyamide resin, and/or an acrylate resin.

In an embodiment of the present inventive concept, the display panel may include an organic light emitting display panel including an organic light emitting element.

In an embodiment of the present inventive concept, a display device includes a display panel configured to display an image. The display panel includes a folding area that folds around a folding axis, and a plurality of non-folding areas that are adjacent to opposite sides of the folding area. A window is disposed on the display surface of the display panel. The window includes a thin film glass layer, a hard coating layer disposed on the thin film glass layer, a shock absorption layer disposed on a rear surface of the thin film glass layer, and an internal adhesive layer disposed between the thin film glass layer and the shock absorption layer and adhering the shock absorption layer to the rear surface of the thin film glass.

BRIEF DESCRIPTION OF THE FIGURES

The accompanying drawings are included to provide a further understanding of the present inventive concept, and are incorporated in and constitute a part of this specification. The drawings illustrate exemplary embodiments of the present inventive concept and, together with the description, serve to explain principles of the present inventive concept. In the drawings.

DETAILED DESCRIPTION

Figure 1:
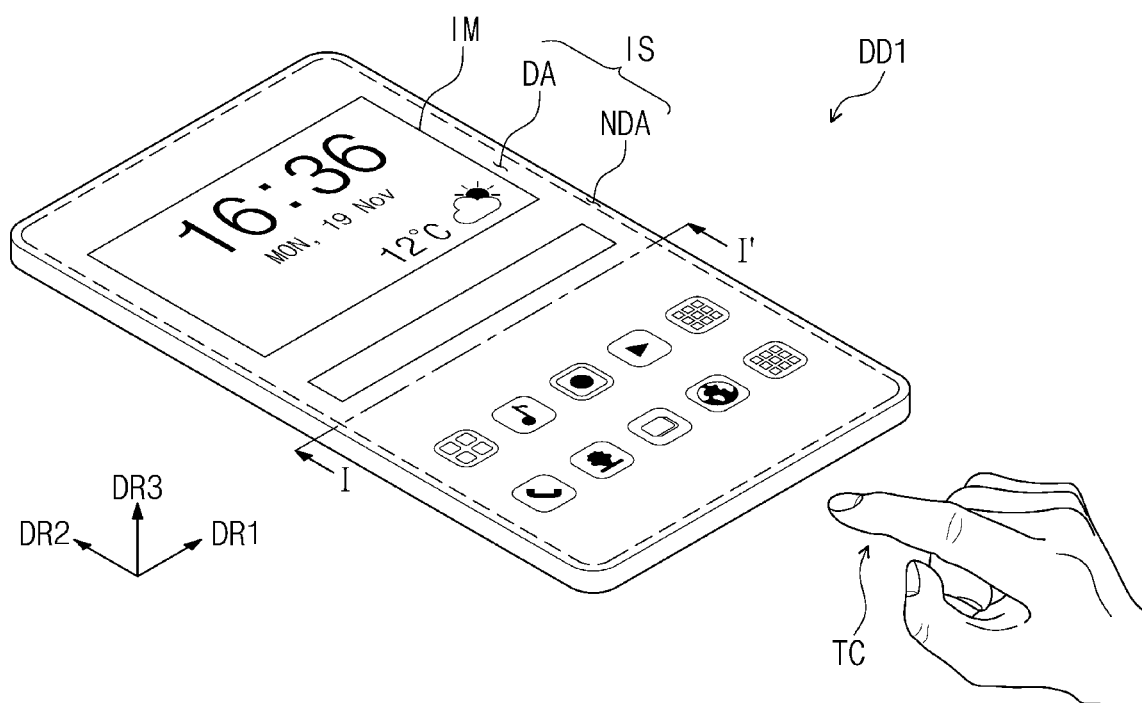
FIG. 1 is a perspective view illustrating a display device according to an embodiment of the present inventive concept.

In describing exemplary embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner.

In this specification, when it is mentioned that a component (or, an area, a layer, a part, etc.) is referred to as being "on", "connected to" or "combined to" another component, this means that the component may be directly on, connected to, or combined to the other component or one or more other components may be disposed between the mentioned components.

Like reference numerals may refer to like elements throughout the disclosure and the drawings. Additionally, in the drawings, the thicknesses, proportions, and dimensions of components may be exaggerated for the purpose of providing an effective description. However, it is to be understood that the relative sizes, thicknesses, shapes, and placements of the components depicted in the drawings does indeed represent at least one exemplary embodiment of the present invention, and so the features illustrated may be seen as describing the properties of an exemplary embodiment of the present invention.

It will be understood that the terms "first" and "second" are used herein to describe various components but these components should not be limited by these terms. The above terms are used only to distinguish one component from another. For example, a first component may be referred to as a second component and vice versa without departing from the scope of the present inventive concept. The singular expressions include plural expressions unless the context clearly dictates otherwise.

In addition, terms such as "below", "the lower side", "on", and "the upper side" are used to describe a relationship of configurations shown in the drawing. The terms are described as a relative concept based on a direction shown in the drawing.

In various embodiments of the present inventive concept, the term "include," "comprise," "including," or "comprising," specifies a property, a region, a fixed number, a step, a process, an element and/or a component but does not exclude other properties, regions, fixed numbers, steps, processes, elements and/or components and thus there may be other elements along with the recited elements. However, the phrase "consisting of" specifies that no other constituents but those recited contribute to the element being described.

Hereinafter, an embodiment of the present inventive concept will be described with reference to the drawings.

Figure 2:
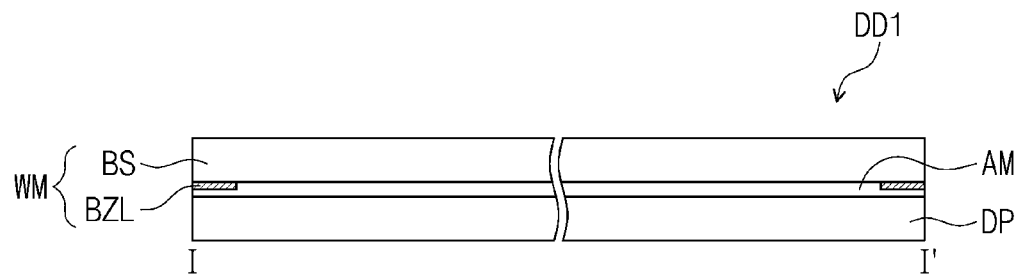
FIG. 2 is a cross-sectional view taken along line I-I' shown in FIG. 1.

FIG. 1 is a perspective view illustrating a display device according to an embodiment of the present inventive concept, and FIG. 2 is a cross-sectional view taken along line I-I' shown in FIG. 1.

Referring to FIG. 1, a display area DA and a non-display area NDA may be defined in a display device DD1.

The display area DA is disposed on a plane defined by a first direction axis DR1 and a second direction axis DR2, and an image IM is displayed in the display DA. A third direction axis DR3 indicates the normal direction of the display area DA, for example, a thickness direction of the display device DD1. The front surface (or an upper surface) and the rear surface (or a lower surface) of each member are divided by the third direction axis DR3. However, the directions that the first to third direction axes DR1, DR2, and DR3 indicate may be converted to other directions as a relative concept. Hereinafter, first to third directions refer to the same reference numerals of the respective directions that the first to third direction axes DR1, DR2, and DR3 indicate.

The display device DD1 may be used in medium-sized electronic devices such as personal computers, notebook computers, personal digital terminals, car navigation units, game consoles, portable electronic devices, and cameras in addition to large-sized electronic devices such as televisions, computer monitors, or digital billboards. In addition, other products may utilize the described display device DD1, and the produces listed herein are offered as examples.

The non-display area NDA is adjacent to the display area DA. The image IM is displayed exclusively within the display area DA and not within the non-display area NDA. A bezel area of the display device DD1 may be defined by the non-display area NDA.

The non-display area NDA may at least partially surround the display area DA. For example, the non-display area NDA may adjoin one or more sides of the display area DA.

Referring to FIGS. 1 and 2, the display device DD1 may include a display panel DP and a window WM. The display panel DP may be a flexible display panel. For example, the display panel DP is flexible and may be deformed by bending, folding, rolling, or the like. It is noted that as used herein, the terms "flexible," "deformable," "bendable," "foldable," "rollable," etc. are meant to indicate that the display panel DP may be manipulated in the stated manner, to a noticeable degree, repeatedly, without cracking or otherwise breaking.

As an example of the present inventive concept, the display panel DP may be an organic light emitting diode (OLED) display panel. The display device DD1 may further include at least one functional layer provided on the display panel DP and at least one protection layer protecting the display panel DP. The functional layer may include an input detection layer sensing a user input TC (for example, a touch operation, etc.) and/or an antireflection layer preventing reflection of external light. The protection layer may be configured to absorb an impact applied from the outside so as to protect the display panel DP from the impact. The protection layer may be provided on the upper part and/or the lower part of the display panel DP.

The window WM may be provided on the display panel DP and may define a display surface IS of the display device DD1 where the image IM is displayed. The window WM may be optically transparent. Accordingly, the image IM generated on the display panel DP may be recognized by the user through the window WM.

The window WM includes a base layer BS and a bezel layer BZL disposed on the rear surface of the base layer BS. The area where the bezel layer BZL is disposed may be defined as the non-display area NDA shown in FIG. 1. According to exemplary embodiments of the present invention, the window WM has a flat shape in the display area DA, but the present inventive concept is not limited thereto, and the shape of the window WM may be modified. For example one or more edges of the window WM may be curved.

The base layer BS may include a thin film glass layer. The base layer BS may have a multi-layer or single-layer structure. For example, the base layer BS may include a thin film glass layer and one or more window functional layers formed on the thin film glass layer.

The bezel layer BZL may be one of the window functional layers. The bezel layer BZL may have a single layer or a multilayer structure. The bezel layer BZL having a multilayer structure may include a pattern layer and an achromatic layer that provide a predetermined pattern. The pattern layer may provide a hairline pattern. The achromatic layer may include an organic mixture including a black pigment or dye. The layers may be formed by vapor deposition, printing, coating, or the like.

Since the window WM is flexible, the shape of the window WM may be deformed together when the shape of the display panel DP is deformed.

In the display device DD1, an optically transparent adhesive layer AM may be provided between the display panel DP and the window WM. The adhesive layer AM may be a pressure sensitive adhesive (PSA), an optical clear adhesive (OCA), or an optical clear resin (OCR). However, the material of the adhesive layer AM is not limited thereto.

The window WM transmits an image from the display panel DP and protects the display panel DP from an external impact at the same time, thereby preventing the display panel DP from being broken or otherwise malfunctioning due to an external impact. The external impact might otherwise causes a defect in the display panel DP and may be, for example, pressure, stress or the like.

The window WM may be configured to reduce bending deformation, compressive deformation, and/or tensile deformation of the display panel DP due to point impact and surface impact, thereby preventing defects of the display panel DP. FIGS. 7A to 7D are cross-sectional views illustrating the structure of a window according to embodiments of the present inventive concept.

Figure 3A:
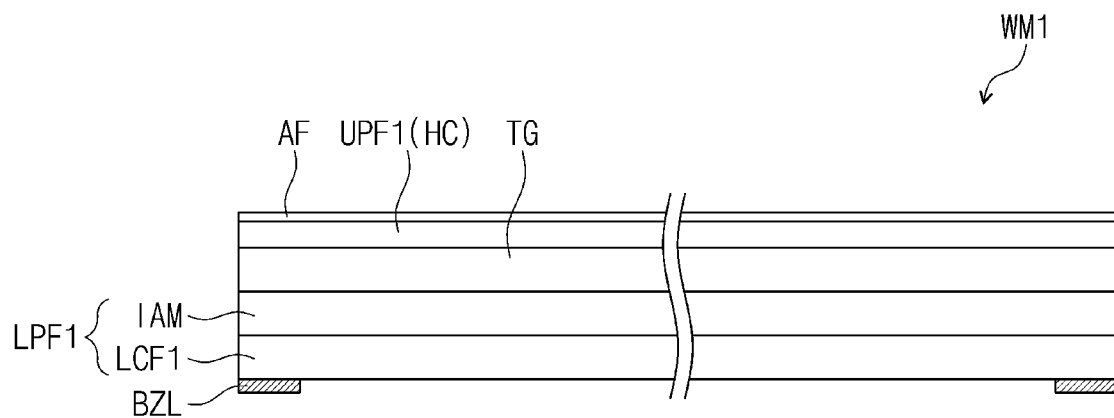
FIGS. 3A to 3D are cross-sectional views illustrating the structure of a window according to embodiments of the present inventive concept.

Referring to FIG. 3A, a window WM1, according to an embodiment of the present inventive concept, includes a first protection layer LPF1, a thin film glass layer TG provided on the first protection layer LPF1, and a second protection layer UPF1 disposed on the thin film glass layer TG. The first and second protection layers LPF1 and UPF1 may be included among the window functional layers.

The thin film glass layer TG may be provided in a plate form. The thin film glass layer TG may be made of a glass material containing silicate. In an embodiment of the present inventive concept, the glass material may further include various materials so as to have excellent durability, surface smoothness, and transparency. For example, the thin film glass layer TG may include a material such as aluminosilicate, borosilicate, boroaluminosilicate, and the like. In an embodiment of the present inventive concept, the thin film glass layer TG may further include an alkali metal, an alkaline earth metal, an oxide thereof, or the like.

In an embodiment of the present inventive concept, the material of the thin film glass layer TG is not limited to the above-mentioned contents, and may be changed into various other glass materials.

The thin film glass layer TG may have a thickness within a range of 30 μm to 70 μm. As used herein, all thickness ranges are understood to be inclusive. The thickness range of the thin film glass layer TG may be thin enough so that the window WM1 is flexible and does not crack or break, but rather bends freely. Further, when the window WM1 is applied to curved, folding, bending and rolling display devices with a deformed shape (a shape that is other than planar), the thickness range of the thin film glass layer TG may be set to a thickness range in which the restorative force is not increased in each shape deformation.

The thin film glass layer TG may have a Young's modulus within a range of 40 GPa to 100 GPa. When the window WM1 is applied to curved, folding, bending and rolling display devices with a deformed shape, the modulus value range of the thin film glass layer TG may be set to a range suitable for each shape deformation.

The second protection layer UPF1 includes a hard coating layer HC disposed on the upper surface of the thin film glass layer TG. The hard coating layer HC is provided on the upper surface of the thin film glass layer TG, for example, on the surface facing the user.

The hard coating layer HC protects the thin film glass layer TG from external impact. The hard coating layer HC may have higher strength than that of the thin film glass layer TG. As an example of the present inventive concept, the hard coating layer HC may have an indentation hardness within a range of 15 HV to 40 HV. Therefore, the hard coating layer HC may prevent the phenomenon that the shape deformation occurs, for example, the phenomenon that micro-cracks, stamping, pressing, and the like occur in the thin film glass layer TG due to point impact or surface impact provided from the outside. As the indentation hardness of the hard coating layer HC increases, when the window WM1 is applied to curved, folding, bending and rolling display devices which are deformed in shape, it is possible to cause window breakage.

The hard coating layer HC may include a urethane resin, an epoxy resin, an acrylic resin, and/or an acrylate resin. The hard coating layer HC may be formed on the thin film glass layer TG by a coating method. For example, the hard coating layer HC may be formed on the thin film glass layer TG using a method such as slot die coating, spin coating, and/or the like.

The hard coating layer HC may have a thickness within a range of 3 μm to 30 μm. The thickness range of the hard coating layer HC may be set so that the window WM1 is flexible. Further, when the window WM1 is applied to curved, folding, bending and rolling display devices with a deformed shape, the thickness range of the hard coating layer HC may be set to a thickness range in which the restorative force is not increased in each shape deformation.

The first protection layer LPF1 includes a first shock absorption layer LCF1 disposed on a rear surface of the thin film glass layer TG and an internal adhesive layer IAM bonding the first shock absorption layer LCF1 to the rear surface of the thin film glass layer TG.

The first shock absorption layer LCF1 is provided on the rear surface of the thin film glass layer TG, for example, on the surface not facing the user. The first shock absorption layer LCF1 may be a layer enhancing the impact resistance of the window WM1 and preventing the window WM1 from shattering when it is broken (e.g. provides shatter resistance).

The first shock absorption layer LCF1 includes urethane resin, epoxy resin, polyester resin, polyether resin, acrylate resin, acrylonitrile-butadiene-styrene (ABS) resin, and/or rubber (e.g. natural or synthetic). As an example of the present inventive concept, the shock absorption layer LCF1 may include phenylene, polyethylene terephthalate (PET), polyimide (PI), polyamide (PAI), polyethylene naphthalate (PEN), and/or polycarbonate (PC).

The first shock absorption layer LCF1 may be attached to the rear surface of the thin film glass layer TG by the internal adhesive layer IAM. The internal adhesive layer (IAM) may be a pressure sensitive adhesive (PSA), an optical clear adhesive (OCA), and/or an optical clear resin (OCR).

In one embodiment of the present inventive concept, each of the first shock absorption layer LCF1 and the internal adhesive layer IAM may have a thickness within a range of 10 μm to 70 μm. In one embodiment of the present inventive concept, the first shock absorption layer LCF1 may have a Young's modulus within a range of 1 GPa to 7 Gpa, and the internal adhesive layer IAM may have a Young's modulus greater than 0 Mpa and less than 1 Mpa.

Although it is shown in FIG. 3A that the first shock absorption layer LCF1 is coupled to the thin film glass layer TG by the internal adhesive layer IAM, the present inventive concept is not limited thereto. For example, the first shock absorption layer LCF1 may be formed directly on the rear surface of the thin film glass layer TG.

The window WM1 may further include a fingerprint prevention layer AF disposed on the second protection layer UPF1. The fingerprint prevention layer AF may be a contamination prevention layer that prevents contamination, such as a user's handprint (e.g., fingerprints).

For example, the fingerprint prevention layer AF may be an oleophobic coating that may reduce the propensity of hand oils, such as those that may be given off by a user's finger, from adhering to the window WM1 and/or may make it easier for the window to be cleaned of any fingerprints that may stick thereto.

The window WM1 may further include an antireflection layer preventing external light from being reflected from the upper surface of the thin film glass layer TG. The antireflection layer may be provided on the second protection layer UPF1 or between the second protection layer UPF1 and the thin film glass layer TG.

The bezel layer BZL is provided corresponding to the non-display area NDA shown in FIG. 1. In an embodiment of the present inventive concept, the bezel layer BZL may be disposed on the rear surface of the first protection layer LPF1. For example, the bezel layer BZL may be formed on the rear surface of the first shock absorption layer LCF1. The bezel layer BZL may include an organic layer and/or an inorganic layer having a predetermined color. The bezel layer BZL may include a dye or a pigment so as to be a predetermined color. For example, the bezel layer BZL may include a black dye or pigment so as to appear black and blend in with the display area DA when it is inactive (e.g. not displaying an image).

In an example of the present inventive concept, the bezel layer BZL may be omitted and may be disposed on another layer.

Figure 3B:
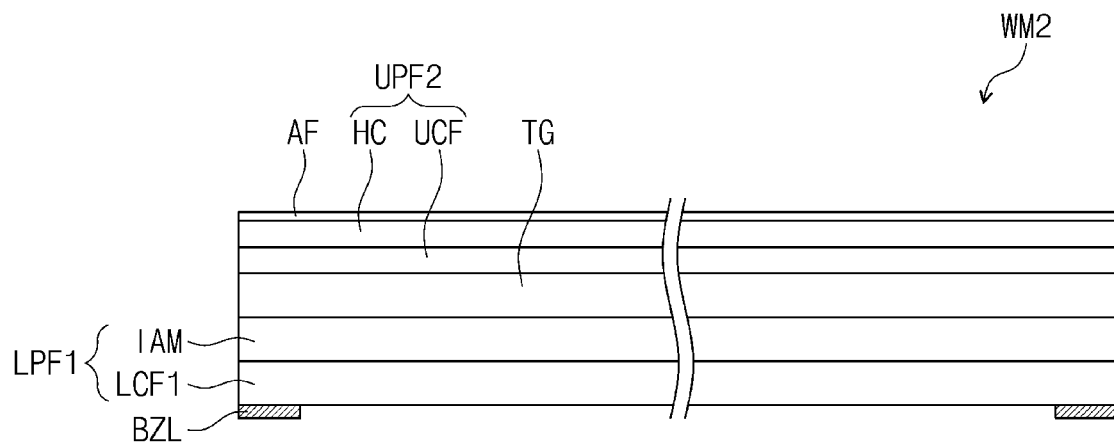

Referring to FIG. 3B, in the window WM2, according to an embodiment of the present inventive concept, the second protection layer UPF2 may further include a second shock absorption layer UCF disposed between the thin film glass layer TG and the hard coating layer HC.

The second shock absorption layer UCF is provided on the upper surface of the thin film glass layer TG, for example, on the surface facing the user. The second shock absorption layer UCF may be a layer increasing the impact resistance of the window WM2.

The second shock absorption layer UCF may be formed on the upper surface of the thin film glass layer TG by a coating method. For example, the second shock absorption layer UCF may be formed on the upper surface of a thin film glass layer TG using a dip coating, a slot die coating, a spin coating, or the like.

The second shock absorption layer UCF may include a urethane resin, an epoxy resin, a polyimide (PI) resin, a polyamide resin, and/or an acrylate resin, which may be formed on a thin film glass layer TG through a coating method. In an embodiment of the present inventive concept, the second shock absorption layer UCF may include polyimide and/or polyamide.

The second shock absorption layer UCF may have a thickness within a range of 5 μm to 50 μm. In an embodiment of the present inventive concept, the second shock absorption layer UCF may have a thickness within a range of 10 μm. Also, the second shock absorption layer UCF may have a Young's modulus within a range of 1 Gpa to 7 Gpa.

Although a structure where the second shock absorption layer UCF is formed directly on the upper surface of the thin film glass layer TG is shown in FIG. 3B, the present inventive concept is not limited thereto. For example, the second shock absorption layer UCF may be coupled to the upper surface of the thin film glass layer TG through the adhesive layer. In such a way, when the second shock absorption layer UCF is attached to the thin film glass layer TG through the adhesive layer, the second shock absorption layer UCF may include a polyimide resin, a polyamide resin, a polyester resin, a polyether resin, an acrylate resin, an acrylonitrile-butadiene-styrene (ABS) resin, and/or rubber (e.g. natural or synthetic).

According to the window WM2, the first protection layer LPF1 includes a first shock absorption layer LCF1 and an internal adhesive layer IAM. The structure of the first protection layer LPF1 shown in FIG. 3B is the same as that of the first protection layer LPF1 shown in FIG. 3A, and thus a redundant description will be omitted. It is to be understood that herein, to the extent that redundant description is omitted, the elements that are not described may be at least similar to corresponding elements that are described elsewhere in the disclosure.

Figure 3C:
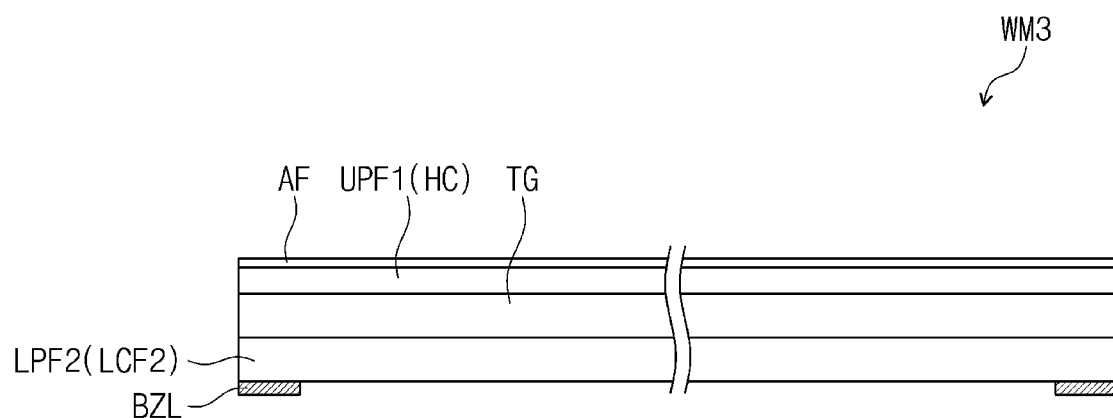

Referring to FIG. 3C, in the window WM3, according to an embodiment of the present inventive concept, since the second protection layer UPF1 has the same structure as the second protection layer UPF1 shown in FIG. 3A, and thus a redundant description will be omitted.

The window WM3 includes a third shock absorption layer LCF2. The third shock absorption layer LCF2 may be formed on the rear surface of the thin film glass layer TG through a coating method unlike the first shock absorption layer LCF1 shown in FIGS. 3A and 3B. For example, the third shock absorption layer LCF2 may be directly formed on the rear surface of the thin film glass layer TG using a dip coating, a slot die coating, a spin coating, or the like.

The third shock absorption layer LCF2 may include a urethane resin, an epoxy resin, a polyimide resin, a polyamide resin, and/or an acrylate resin. In an embodiment of the present inventive concept, the first shock absorption layer LCF2 may include polyimide (PI) and/or polyamide (PAI).

The third shock absorption layer LCF2 may have a thickness within a range of 5 μm to 70 μm. In an embodiment of the present inventive concept, the third shock absorption layer LCF2 may have a thickness within a range of 50 μm. Also, the third shock absorption layer LCF2 may have a Young's modulus within a range of 1 Gpa to 7 Gpa. The thickness of the third shock absorption layer LCF2 may have one of the above thickness ranges so that window WM3 has the desired impact resistance.

Figure 3D:
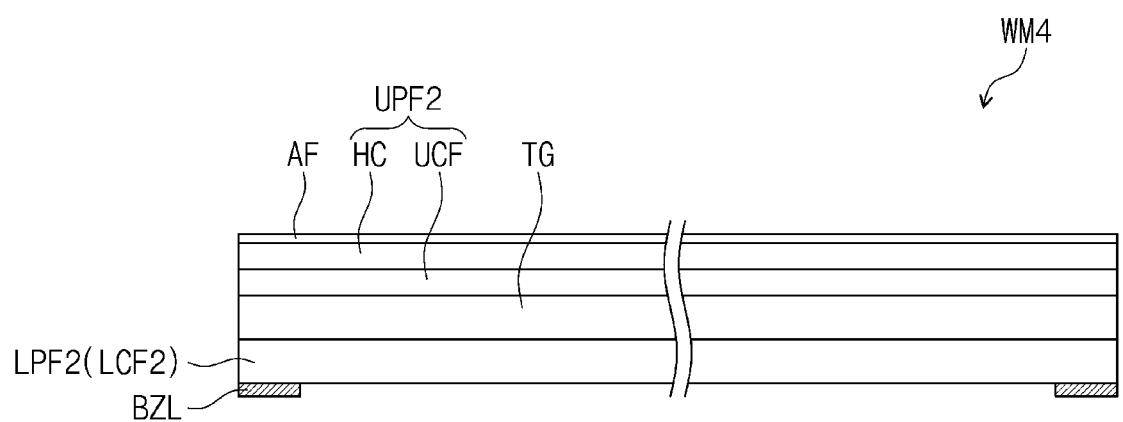

Referring to FIG. 3D, in the window WM4, according to an embodiment of the present inventive concept, since the second protection layer UPF2 has the same structure as the second protection layer UPF2 shown in FIG. 3B, and thus a redundant description will be omitted.

In addition, in the window WM4, since the first protection layer LPF2 has the same structure as the first protection layer LPF2 shown in FIG. 3C, and thus a redundant description will be omitted.

However, the third shock absorption layer LCF2 of the first protection layer LPF2 and the second shock absorption layer UCF of the second protection layer UPF2 are both formed on the thin film glass layer TG through a coating method. The second shock absorption layer UCF and the third shock absorption layer LCF2 may be formed on the upper surface and the rear surface of the thin film glass layer TG, respectively, through separate coating processes.

However, in an example of the present inventive concept, the second and third shock absorption layers UCF and LCF2 may be simultaneously coated on the thin film glass layer TG. For example, the second and third shock absorption layers UCF and LCF2 may be simultaneously coated on the upper surface and the rear surface of the thin film glass layer TG through a dip coating method, respectively.

Each of the windows WM1 to WM4 described with reference to FIGS. 3A to 3D may have a Young's modulus within a range of 30 GPa to 100 GPa.

Figure 4:
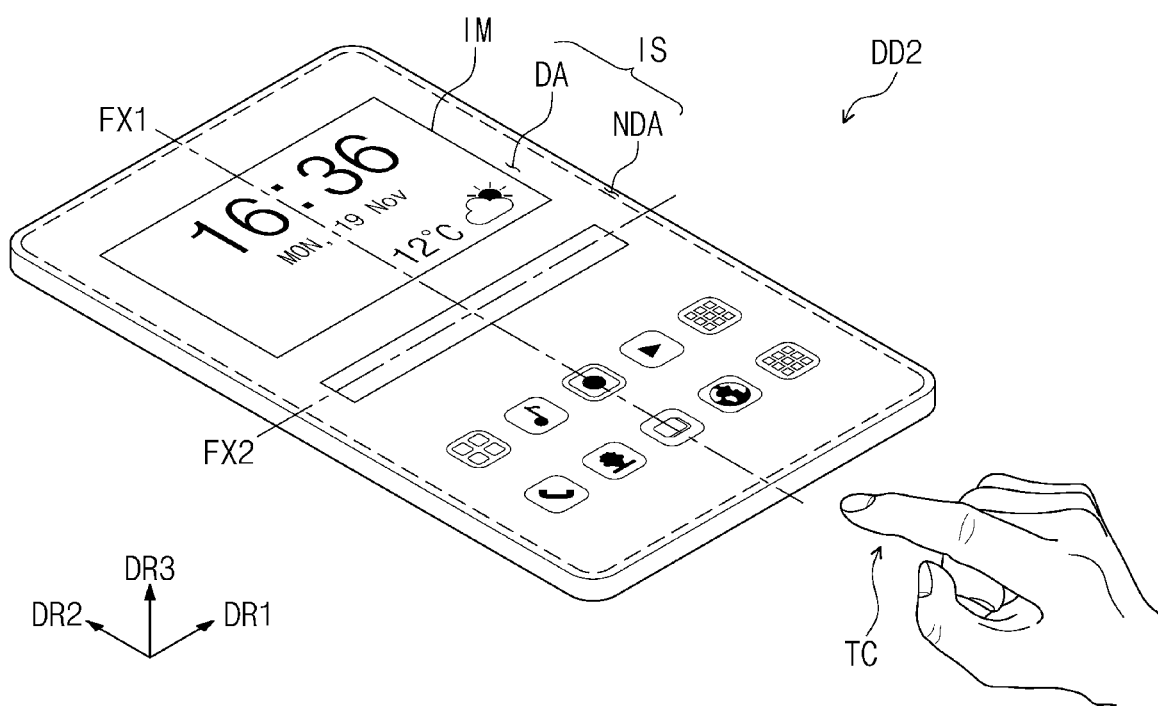
FIG. 4 is a perspective view of a foldable display device according to an embodiment of the present inventive concept.
Figure 5A:
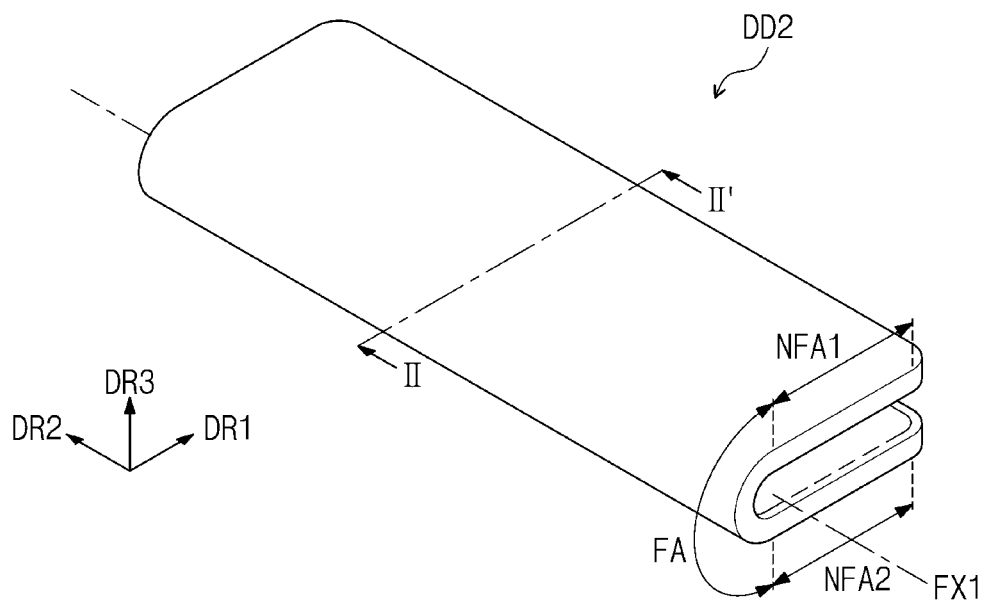
FIG. 5A is a perspective view illustrating a state in which the display device shown in FIG. 4 is folded in along a first folding axis.
Figure 5B:
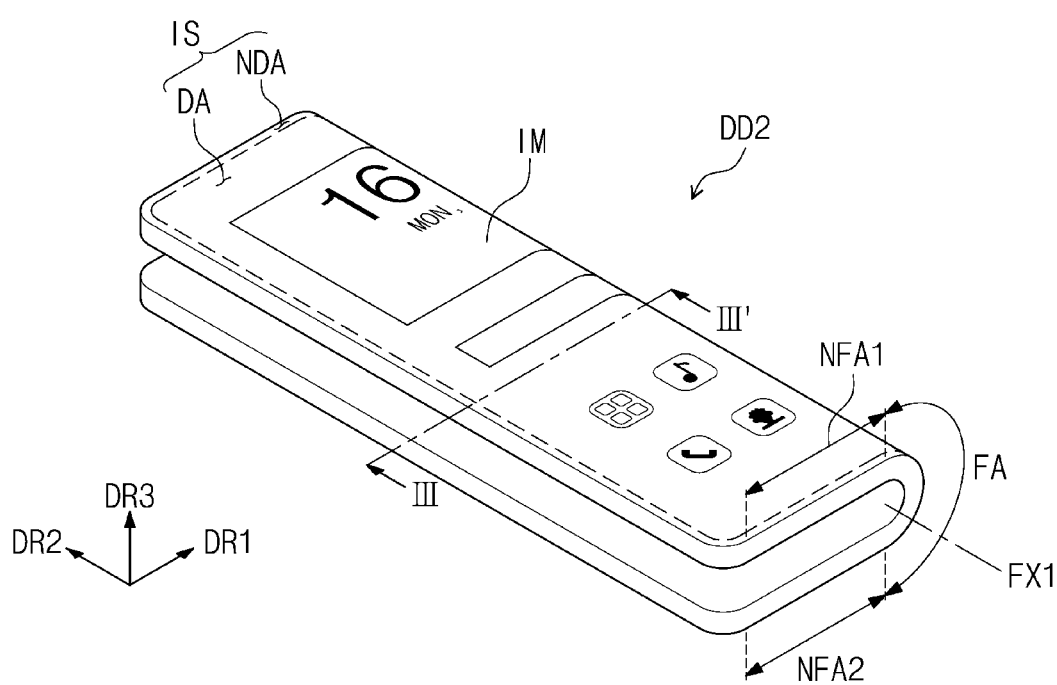
FIG. 5B is a perspective view illustrating a state in which the display device shown in FIG. 4 is folded out along a first folding axis.

FIG. 4 is a perspective view of a display device according to an embodiment of the present inventive concept. FIG. 5A is a view showing a state in which the display device shown in FIG. 4 is folded in along a first folding axis, and FIG. 5B is a view showing a state in which the display device shown in FIG. 4 is folded out along the first folding axis.

Referring to FIGS. 4 and 5A, the display device DD2 may be a foldable display device. It may be folded based on a folding axis (e.g., the first folding axis FX1, and the second folding axis FX2) extending in a predetermined direction. Hereinafter, a folded state based on the folding axes FX1 and FX2 is defined as a folding state, and an unfolded state is defined as the non-folding state.

A plurality of areas may be defined in the display device DD2 according to the operation mode. The plurality of areas may be divided into a folding area FA and at least one non-folding area NFA1 or NFA2. The folding area FA is defined between two non-folding areas NFA1 and NFA2.

In an exemplary embodiment of the present inventive concept, the non-folding areas NFA1 and NFA2 may include a first non-folding area NFA1 and a second non-folding area NFA2. The first non-folding area NFA1 is adjacent to one side of the folding area FA in the first direction DR1, and the second non-folding area NFA2 is adjacent to the other side of the folding area FA in the first direction DR1.

The display device DD2 may be folded in or folded out. Herein, folded in refers to the display surface IS folded to face each other, and folded out refers to the rear surface of the display device DD2 folded to face each other. Thus, in the folded in state, the display device DD2 is folded such that the display surface IS is not exposed and is protected, although it is also not particularly visible in this state. In the folded out state, however, the display device DD2 is folded such that the display surface IS is fully exposed, and although it is not protected in this state, the display surface IS remains visible.

The folding area FA is an area that forms a curvature substantially corresponding to a folding area based on the first or second folding axis FX1 or FX2. Here, the first folding axis FX1 may extend in the second direction DR2, e.g., the major axis direction of the display device DD2, and the second folding axis FX2 may extend in the first direction DR1, e.g., the minor axis direction of the display device DD2.

The display device DD2 shown in FIG. 5A may be folded in such that the display surface IS of the first non-folding area NFA1 faces the display surface IS of the second non-folding area NFA2.

Referring to FIG. 5B, the display device DD2 may be folded out with respect to the first folding axis FX1. When the display device DD2 is folded out, the display surface IS may be exposed to the outside.

In the display device DD2, folding in and folding out may occur at the same time. However, in an embodiment of the present inventive concept, the display device DD2 may be folded in or folded out.

It is noted that according to some exemplary embodiments of the present invention, some display devices may be configured to fold from an unfolded state to a folded in state, but not a folded out state, while other display devices may be configured to fold from an unfolded state to a folded out state, but not a folded in state. Display devices such as these may thereby only fold into one or the other folding state. However, other display devices may be configured to fold into either the folded in state or the folded out state.

It is also noted that while only one fold has been shown here, exemplary embodiments of the present invention may be multiply folded such that two opposite ends each fold towards the center (e.g. non-overlapping folds) or the display device may be folded in half lengthwise and then folded half again widthwise (e.g. overlapping folds) by applying the disclosed structure and techniques multiple times.

Figure 6A:
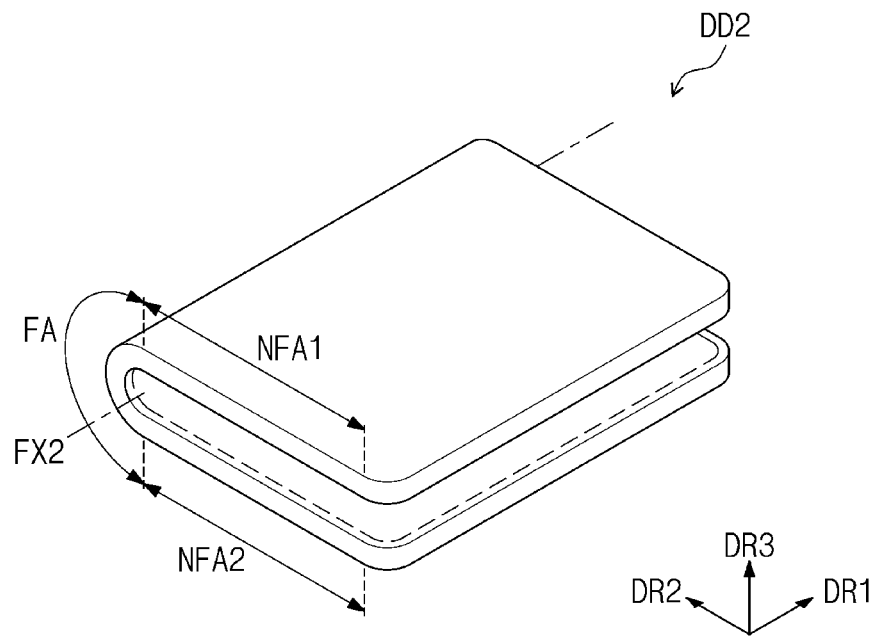
FIG. 6A is a perspective view illustrating a state in which the display device shown in FIG. 4 is folded in along a second folding axis.
Figure 6B:
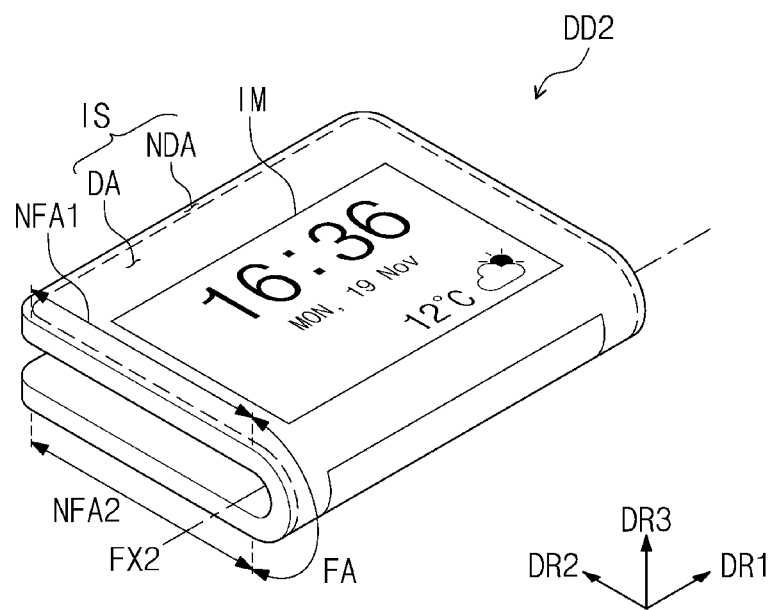
FIG. 6B is a perspective view illustrating a state in which the display device shown in FIG. 4 is folded out along a second folding axis.

FIG. 6A is a view showing a state in which the display device shown in FIG. 4 is folded in along a second folding axis, and FIG. 6B is a view showing a state in which the display device shown in FIG. 4 is folded out along the second folding axis.

It is noted that here again, it may either be a single device that can be folded along either folding axis or different devices may be configured to fold along different folding axes.

Referring to FIGS. 6A and 6B, the display device DD2 may be folded in or folded out with respect to the second folding axis FX2. The second folding axis FX2 may extend along the first direction DR1 and may be in the minor axis direction of the display device DD2.

The display device DD2 includes the first and second folding axes FX1 and FX2 and is capable of folding in either the minor axis direction or the major axis direction. However, in an example of the present inventive concept, the display device DD2 may have only one folding axis, which may be either the first or second folding axes FX1 and FX2.

In the present embodiment, one folding area FA is defined in the display device DD2, but the present inventive concept is not limited thereto. According to an embodiment of the present inventive concept, a plurality of folding areas may be defined in the display device DD2. In this respect, the single device may be folded in one or more of a number of different ways.

Figure 7A:
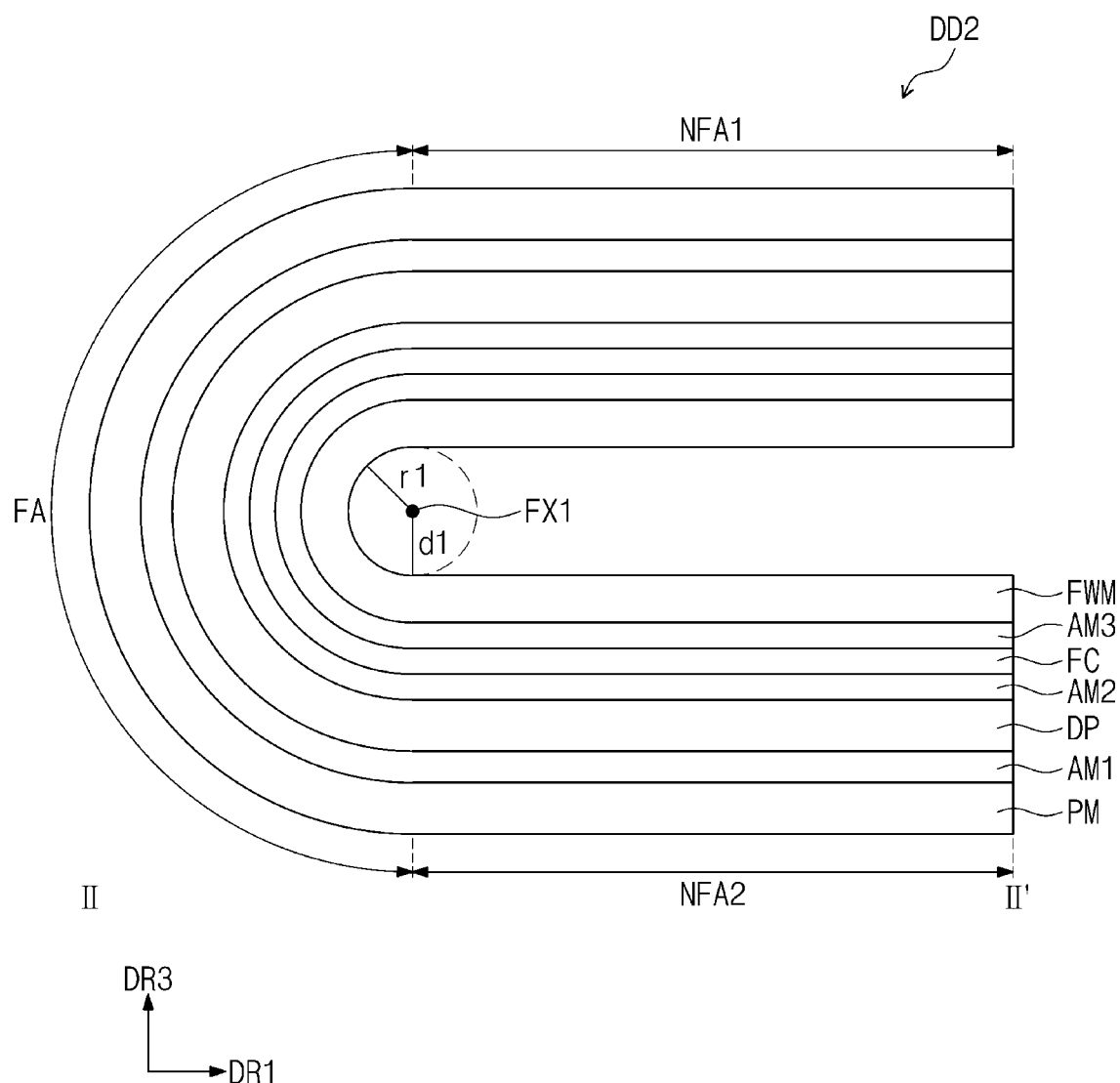
FIG. 7A is a cross-sectional view of the display device in the folded in state shown in FIG. 5A, which is taken along line II-II'.

FIG. 7A is a cross-sectional view of the display device in the folded in state shown in FIG. 5A, which is taken along line II-II'.

Referring to FIGS. 5A and 7A, the display device DD2 is folded in with respect to the first folding axis FX1. The display device DD2 includes a display module DM and a window FWM. The display module DM includes a protection layer PM, a display panel DP, a functional layer FC, a first adhesive layer AM1, and a second adhesive layer AM2.

The display panel DP may be a flexible display panel. Accordingly, the display device DD2 may be folded or unfolded around the first folding axis FX1. As an example of the present inventive concept, the display panel DP may be an organic light emitting diode (OLED) display panel.

As an example of the present inventive concept, the display panel DP may further include an input detection unit for detecting an external input. The input detection unit may be integrated into the display panel DP through at least one continuous process. For example, the input detection unit may be disposed directly on the thin film encapsulation layer of the display panel DP. Here, the direct placement means that the input detection unit is disposed on the display panel DP without a separate adhesive member interposed therebetween. The input detection unit will be described later in detail with reference to FIG. 14. In an embodiment, the input detection unit may be disposed on the display panel DP in the form of a panel.

The window FWM may include a flexible material and may be folded or unfolded around the first folding axis FX1. The window FWM will be described later in detail with reference to FIGS. 8A to 9B.

At least one functional layer FC may be disposed between the display panel DP and the window FWM. As an example of the present inventive concept, the functional layer FC may be an antireflection layer blocking external light reflection. The antireflection layer may prevent the elements constituting the display panel DP from being visually recognized from the outside by the external light incident through the front surface of the display device DD2. The antireflective layer may include a polarizing film and/or a phase retardation film. The number of phase retardation films and the phase retardation length ($\lambda/4$ or $\lambda/2$) of the phase retardation film may be determined according to the operation principle of the antireflection layer.

In an embodiment of the present inventive concept, the functional layer FC may include a plurality of functional layers. In this case, each functional layer may perform different functions.

The display panel DP and the functional layer FC may be adhered to each other through the second adhesive layer AM2.

A protection layer PM may be disposed on the rear surface of the display panel DP. The protection layer PM may include a polymeric material. The protection layer PM may absorb an impact applied from the outside to protect the display panel DP from impact. The protection layer PM may be adhered to the rear surface of the display panel DP through the first adhesive layer AM1.

It is shown in FIG. 7A that the protection layer PM is located on the rear surface of the display panel DP, but the present inventive concept is not limited thereto. For example, a protection layer may be additionally formed on the upper surface of the display panel DP, for example, between the functional layer FC and the display panel DP, or the upper surface of the functional layer FC, for example, between the functional layer FC and the window FWM, The protection layer PM may include a polymeric material. In an embodiment of the present inventive concept, the protection layer PM may include a plastic film as a base layer. The protection layer PM may include a plastic film including polyethersulfone (PES), polyacrylate, polyetherimide (PEI), polyethylenenaphthalate (PEN), polyethyleneterephthalate (PET), polyphenylene sulfide (PPS), polyarylate, polyimide (PI), polycarbonate (PC), and/or poly(arylene ethersulfone).

A material constituting the protection layer PM is not limited to plastic resins and may include an organic/inorganic composite material. The protection layer PM may include an inorganic material filled in the pores of a porous organic layer and an organic layer. In an embodiment of the present inventive concept, the protection layer PM may be made of a hydrophilic material. Therefore, the protection layer PM may prevent external moisture from penetrating the display panel DP.

The window FWM may be fixed to the display module DM through the third adhesive layer AM3. For example, the window FWM may be fixed to the upper surface of the functional layer FC of the display module DM.

The first to third adhesive layers AM1 to AM3 may be optically transparent. The first to third adhesive layers AM1 to AM3 may be an adhesive layer hardened and manufactured after a liquid adhesive material is applied, or may be a separately manufactured adhesive sheet. For example, the first to third adhesive layers AM1 to AM3 may each be a pressure sensitive adhesive (PSA), an optical clear adhesive (OCA), and/or an optical clear resin (OCR). In an embodiment of the present inventive concept, at least one of the first to third adhesive layers AM1 to AM3 may be omitted.

According to FIG. 7A, the display device DD2 may be folded in with respect to the first folding axis FX1 by the user's operation. During folding in, the upper surface of the window FWM, for example, the upper surface corresponding to the first non-folding area NFA1, may face the upper surface corresponding to the second non-folding area NFA2.

During folding in, the curvature radius r1 of the display device DD2 may be defined as the separation distance from the first folding axis FX1 to the upper surface of the window FWM.

In the folding state, the first non-folding area NFA1 and the second non-folding area NFA2 may face each other. For example, the first non-folding area NFA1 and the second non-folding area NFA2 may face each other and be parallel to each other. The area of the folding area FA is not fixed but may be determined according to the curvature radius r1. The display device DD2 may receive or display an image in a folded state.

Figure 7B:
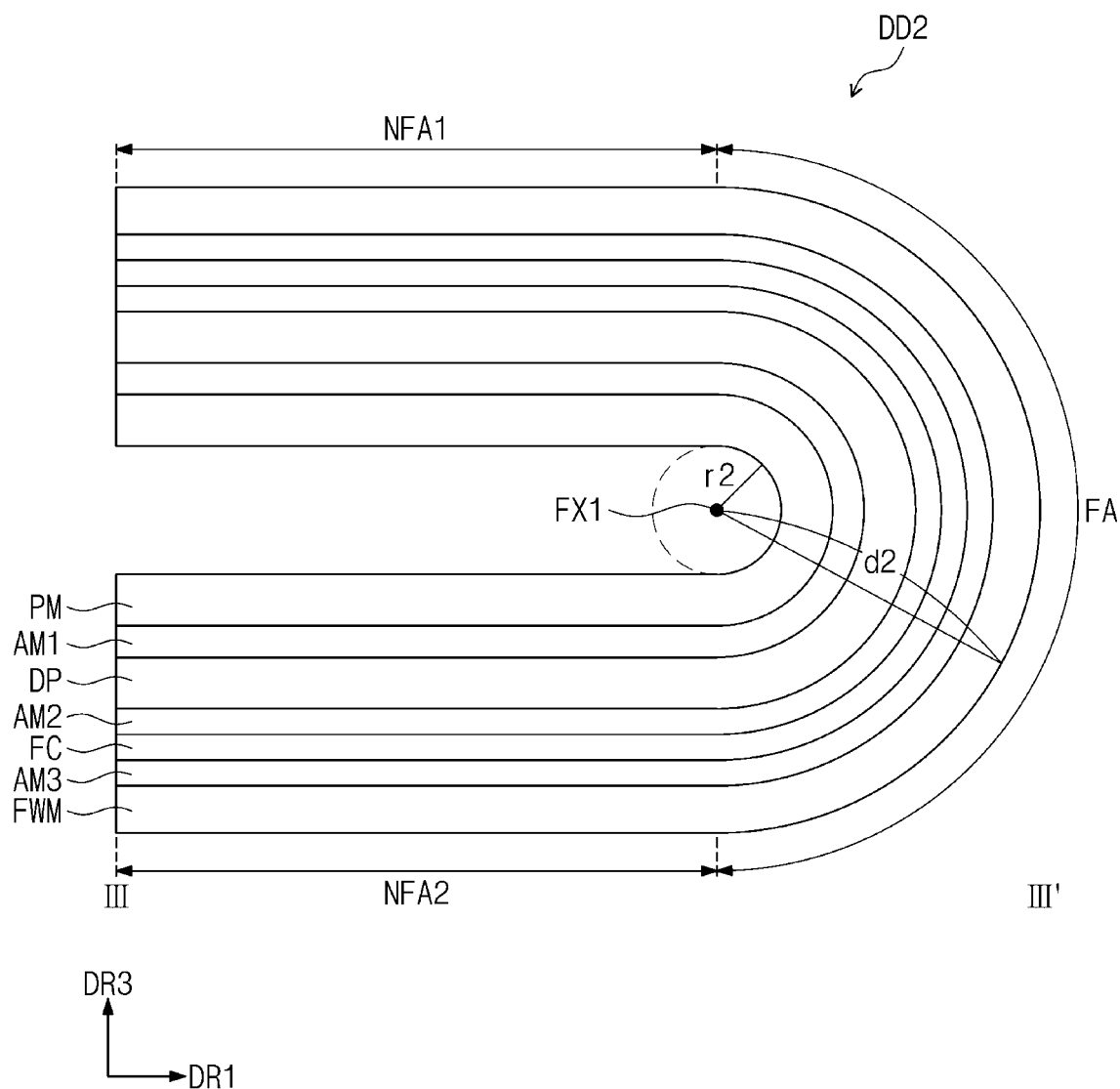
FIG. 7B is a cross-sectional view of the display device in the folded out state shown in FIG. 5B, which is taken along line III-III'.

FIG. 7B is a cross-sectional view of the display device in the folded out state shown in FIG. 5B, which is taken along line III-III'.

Referring to FIGS. 7B and 5B, the display device DD2 may be folded out with respect to the first folding axis FX1 by the user's operation. During folding out, the upper surface of the window FWM may be exposed to the outside.

During folding out, the curvature radius r2 of the display device DD2 may be defined as the separation distance from the first folding axis FX1 to the rear surface of the protection layer PM.

Referring to FIGS. 7A and 7B, the distance d1 (e.g., the first window curvature radius) between the first folding axis FX1 and the upper surface of the window FWM during folding in is different from the distance d2 (e.g., the second window curvature radius) between the first folding axis FX1 and the upper surface of the window FWM during folding out.

During folding in, the curvature radius r1 of the display device DD2 may be the same as the first window curvature radius d1. However, during folding out, the second window curvature radius r2 is larger than the curvature radius r1 of the display device DD2. For example, the window FWM employed in the folding in display device DD2 is located at the innermost position with respect to the first folding axis FX1 of the display device DD2, and receives a large bending stress. Therefore, the window FWM employed in the folding in display device DD2 requires a low bendability limit. Here, the bendability limit may be a curvature radius limit. The curvature radius limit may be defined as the minimum curvature radius that does not cause breaking, cracking, and/or delamination of the window FWM during bending.

The window FWM employed in the folding out display device DD2 is located at the outermost position with respect to the first folding axis FX1 of the display device DD2, and the window FWM receives a less bending stress. Thus, the window FWM employed in the folding out display device DD2 may require a higher bendability limit than the window FWM employed in the folding in display device DD2.

FIGS. 8A to 8D are cross-sectional views illustrating the structure of a window according to embodiments of the present inventive concept. FIG. 9A is a cross-sectional view illustrating a folding out state of the window shown in FIG. 8A. FIG. 9B is a cross-sectional view illustrating a folding out state of the window shown in FIG. 8B.

Figure 8A:
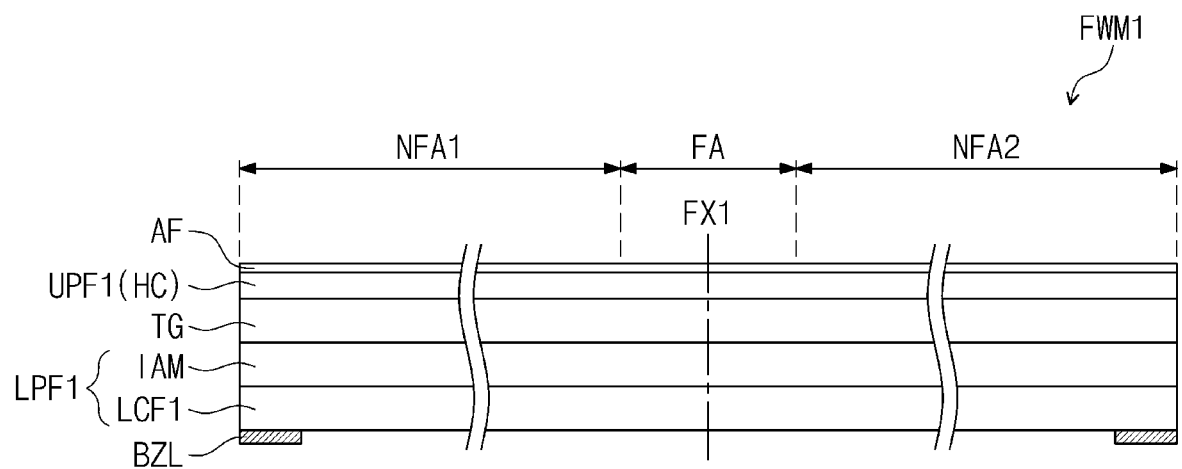
FIGS. 8A to 8D are cross-sectional views illustrating the structure of a window according to embodiments of the present inventive concept.
Figure 9A:
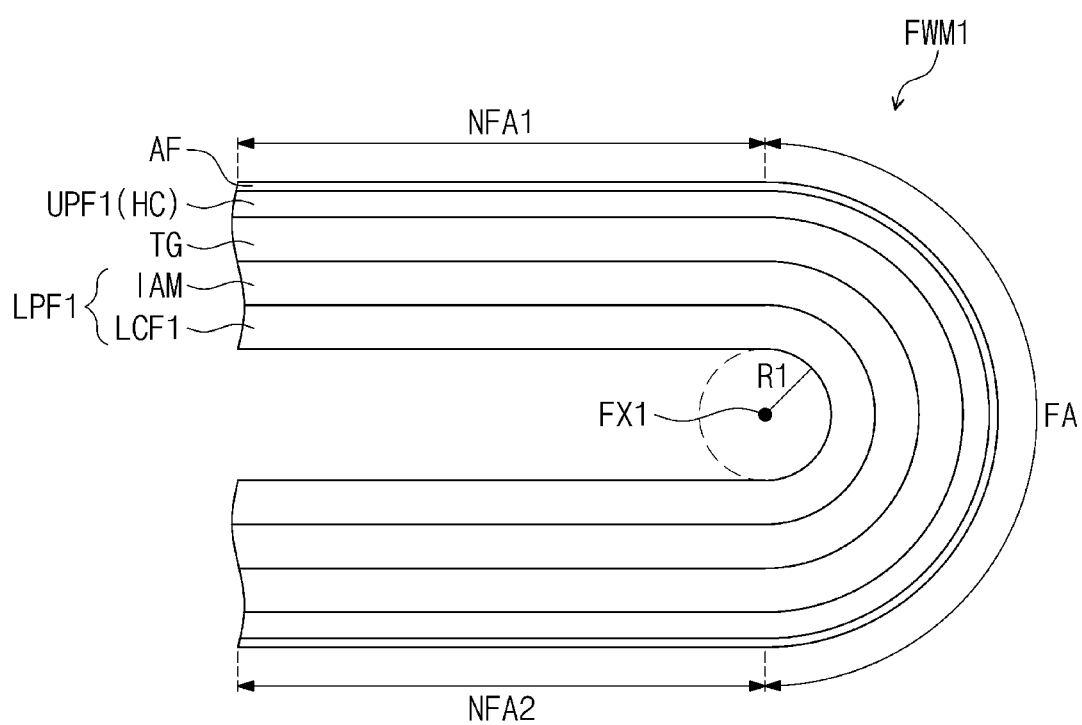
FIG. 9A is a cross-sectional view illustrating a folded out state of the window shown in FIG. 8A.
Figure 9B:
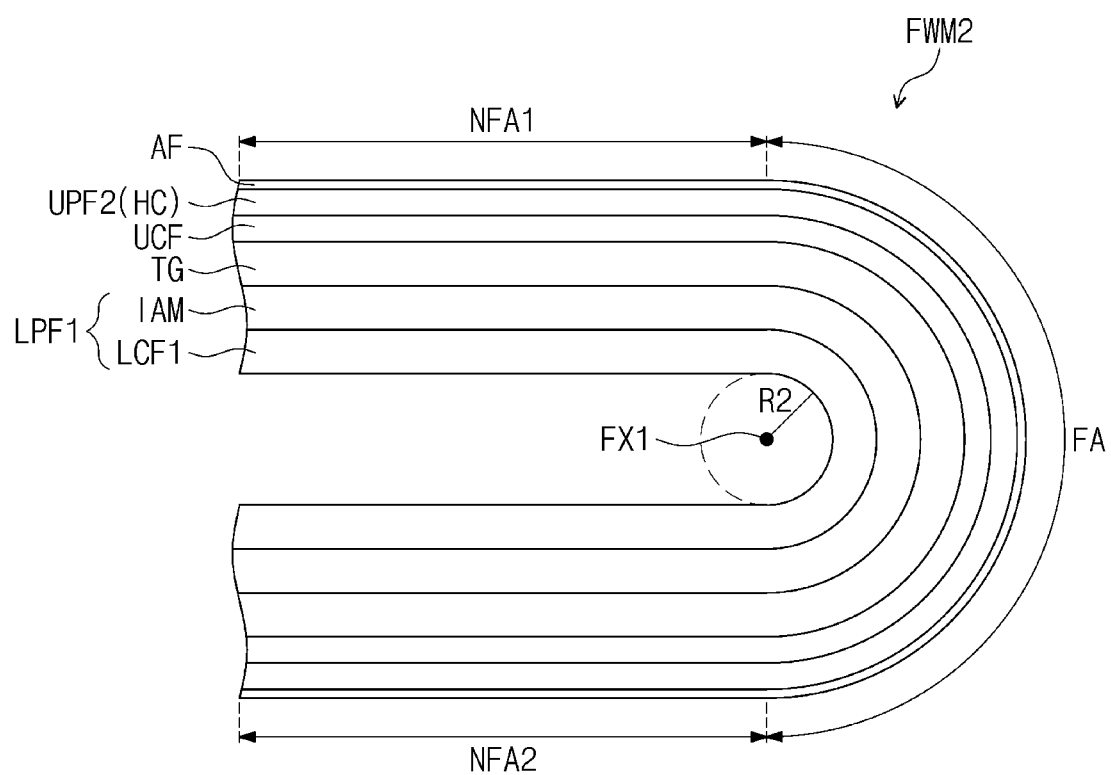
FIG. 9B is a cross-sectional view illustrating a folded out state of the window shown in FIG. 8B.

Referring to FIGS. 8A and 9A, a window FWM1, according to an embodiment of the present inventive concept, includes a first protection layer LPF1, a thin film glass layer TG provided on the first protection layer LPF1, and a second protection layer UPF1 disposed on the thin film glass layer TG.

The thin film glass layer TG may be provided in a plate form. The thin film glass layer TG may be made of a glass material containing silicate.

The thin film glass layer TG may have a thickness within a range of 30 µm to 70 µm. The thickness range of the thin film glass layer TG may be set so that the window FWM1 is flexible. The thickness range of the thin film glass layer TG may be set to a thickness range in which the restorative force against the shape deformation during folding of the window FWM1 is not increased. As one example of the present inventive concept, the thin film glass layer TG may have a thickness within a range of 30 µm to 70 µm.

The second protection layer UPF1 includes a hard coating layer HC disposed on the upper surface of the thin film glass layer TG. The hard coating layer HC is provided on the upper surface of the thin film glass layer TG, for example, on the surface facing the user. The hard coating layer HC protects the thin film glass layer TG from external impact.

The hard coating layer HC may have higher indentation hardness than the thin film glass layer TG. Therefore, the hard coating layer HC may prevent the phenomenon that the shape deformation occurs, for example, the phenomenon that micro-cracks, stamping, pressing, and the like occur in the thin film glass layer TG due to point impact or surface impact provided from the outside.

However, if the indentation hardness of the hard coating layer HC increases, it may cause window breakage during folding of the window FWM1. Accordingly, as an example of the present inventive concept, the hard coating layer HC may have an indentation hardness within a range of 15 HV to 40 HV.

The thickness range of the hard coating layer HC may be set so that the window FWM1 is flexible. In addition, the hard coating layer HC may have a thickness range in which the restorative force on shape deformation does not increase when the window FWM1 is folded. As one example of the present inventive concept, the hard coating layer HC may have a thickness within a range of 3 µm to 30 µm. Preferably, the hard coating layer HC may have a thickness within a range of 6 µm to 14 µm.

The first protection layer LPF1 includes a first shock absorption layer LCF1 disposed on a rear surface of the thin film glass layer TG and an internal adhesive layer IAM for bonding the first shock absorption layer LCF1 to the rear surface of the thin film glass layer TG.

The first shock absorption layer LCF1 is provided on the rear surface of the thin film glass layer TG, for example, on the surface not facing the user. The first shock absorption layer LCF1 may be a layer enhancing the impact resistance of the window FWM1 and preventing the damage. The first shock absorption layer LCF1 may be attached to the rear surface of the thin film glass layer TG by the internal adhesive layer IAM. In one embodiment of the present inventive concept, each of the first shock absorption layer LCF1 and the internal adhesive layer IAM may have a thickness within a range of 10 µm to 70 µm.

The window FWM1 may further include a fingerprint prevention layer AF disposed on the second protection layer UPF1. The fingerprint prevention layer AF may be a contamination prevention layer that prevents contamination, such as a user's handprint (e.g., fingerprints).

The bezel layer BZL is provided corresponding to the non-display area NDA shown in FIG. 1. In an embodiment of the present inventive concept, the bezel layer BZL may be disposed on the rear surface of the first protection layer LPF1.

In such a way, by additionally placing a hard coating layer HC on the upper surface of the thin film glass layer TG, the impact resistance of the window FWM1 may be increased.

Impact resistance may be checked by point impact test or surface impact test. Point impact refers to the impact applied to a window when a pointed object, such as a pen, falls from an arbitrary height from a window surface to the window surface. Surface impact refers to the impact that a device, such as a ball, applies on the window, and the surface impact test measures the amount of impact load that the window absorbs when a ball of a predetermined size and weight falls to the upper part of the window. Under the same conditions, the point impact and surface impact tests were performed on the window FWM1 with the hard coating layer HC and a comparison window with the hard coating layer HC removed. It is shown that the window FWM1 shown in FIGS. 8A and 9A absorbs impacts up to 9 cm from the surface of the window FWM1 in the point impact test and the surface impact test, but the comparison window absorbs impacts up to 4 cm and 5 cm in the point impact test and the surface impact test. For example, when the hard coating layer HC is provided, impact resistance is increased.

As shown in FIG. 9A, in the window FWM1, a folding area FA and first and second non-folding areas NFA1 and NFA2 spaced apart from the folding area FA may be defined. The folding axis FX1 may be located within the folding area FA and the window FWM1 may be folded out with respect to the folding axis FX1. Here, the out-folding state of the window FWM1 may be defined to be a folded state so that the upper surface of the window FWM1, e.g., the fingerprint prevention layer AF, is exposed to the outside.

The curvature radius R1 of the folded out window FWM1 may be defined as the distance from the folding axis FX1 to the rear surface of the first protection layer LPF1. The curvature radius limit that the window FWM1 may withstand without bending may be defined as bendability limit. The bendability limit of the window FWM1, according to FIGS. 8A and 9A, may be approximately 2.5 mm.

Figure 8B:
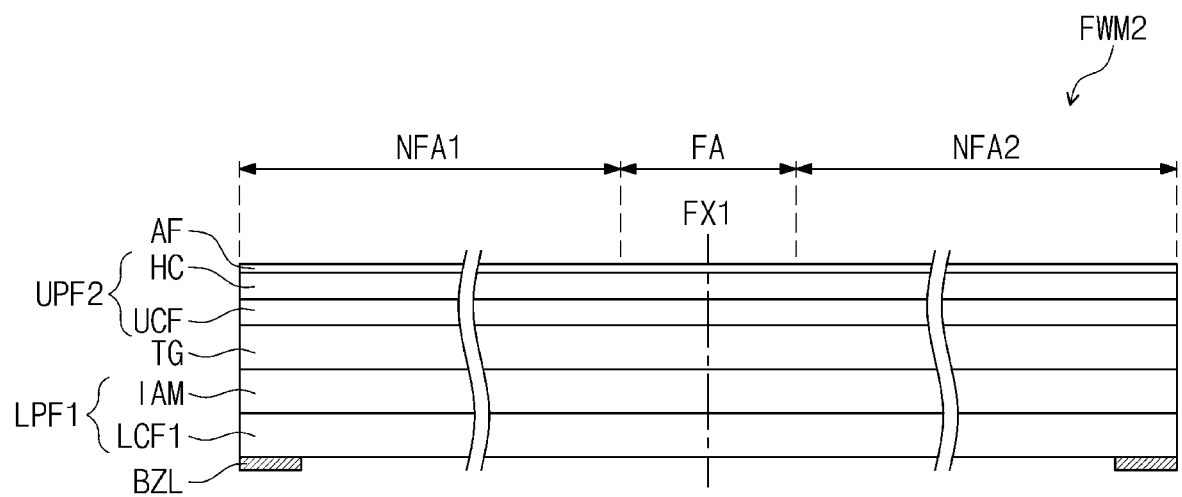

Referring to FIGS. 8B and 9B, in the window FWM2, according to an embodiment of the present inventive concept, a second protection layer UPF2 may further include a second shock absorption layer UCF disposed between the upper surface of the thin film glass layer TG and the hard coating layer HC.

The second shock absorption layer UCF is provided on the upper surface of the thin film glass layer TG, for example, on the surface facing the user. The second shock absorption layer UCF may be a layer increasing the impact resistance of the window FWM2.

The second shock absorption layer UCF may have a thickness within a range of 5 μm to 50 μm. In an embodiment of the present inventive concept, the second shock absorption layer UCF may have a thickness within a range of 10 μm. Also, the second shock absorption layer UCF may have a Young's modulus within a range of 1 Gpa to 7 Gpa.

According to the window FWM2, the first protection layer LPF1 includes a first shock absorption layer LCF1 and an internal adhesive layer IAM. The structure of the first protection layer LPF1 shown in FIG. 8B is the same as that of the first protection layer LPF1 shown in FIG. 8A, and thus a redundant description will be omitted.

As shown in FIG. 9B, in the window FWM2 structure in which the second protection layer UPF2 further includes the second shock absorption layer UCF, the curvature radius R2 of the folded out window FWM2 may increase. Under the same conditions, the bendability limit of the window FWM1 according to FIGS. 8A and 9A is 2.5 mm, and the bendability limit of the window FWM2 according to FIGS. 8B and 9B may be approximately 3.0 mm. For example, the window FWM2 may have a lower bending strength than the window FWM1.

However, when the point impact and surface impact tests are performed under the same conditions, the window FWM1 shown in FIGS. 8A and 9A absorbed impacts up to 9 cm height in the point impact and surface impact tests. It is shown that the window FWM2 shown in FIGS. 8B and 9B absorbs impacts up to 10 cm and 11 cm height in the point impact and surface impact tests, respectively. For example, the window FWM2 including the first shock absorption layer UCF may have a higher impact resistance than the window FWM1.

Figure 8C:
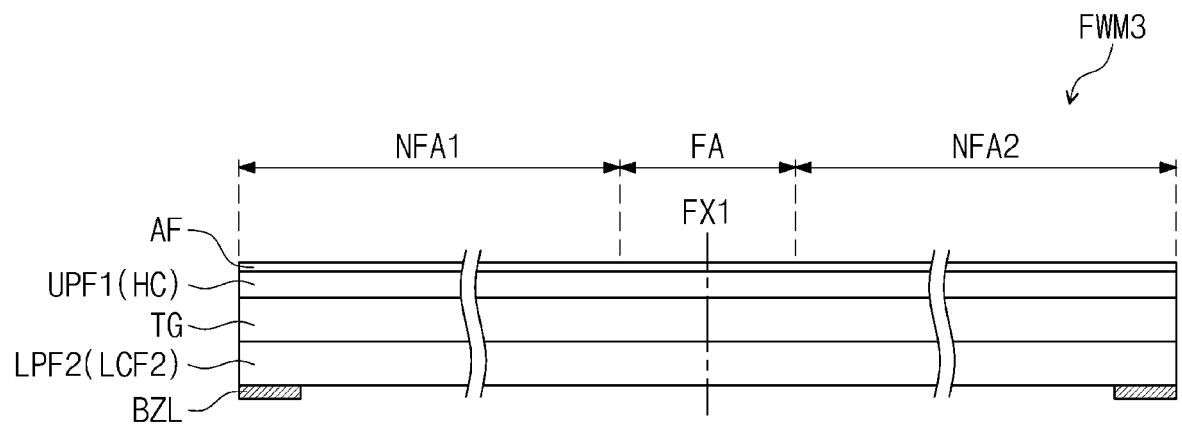

Referring to FIG. 8C, in the window FWM3, according to an embodiment of the present inventive concept, since the second protection layer UPF1 has the same structure as the second protection layer UPF1 shown in FIG. 8A, a redundant description will be omitted.

The window FWM3 includes a third shock absorption layer LCF2. The third shock absorption layer LCF2 may be formed on the rear surface of the thin film glass layer TG through a coating method unlike the first shock absorption layer LCF1 shown in FIGS. 8A and 8B. For example, the third shock absorption layer LCF2 may be directly formed on the rear surface of a thin film glass layer TG using a dip coating, a slot die coating, a spin coating, and the like.

The third shock absorption layer LCF2 may have a thickness within a range of 5 μm to 70 μm. In an embodiment of the present inventive concept, the third shock absorption layer LCF2 may have a thickness within a range of 50 μm. Also, the third shock absorption layer LCF2 may have a Young's modulus within a range of 1 Gpa to 7 Gpa.

Figure 8D:
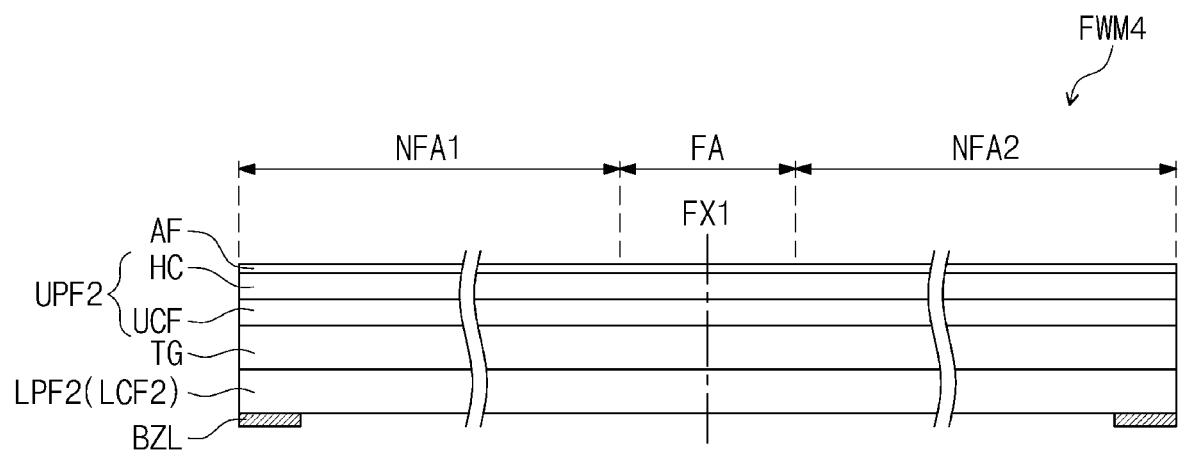

Referring to FIG. 8D, in the window FWM4 according to an embodiment of the present inventive concept, since the second protection layer UPF2 has the same structure as the second protection layer UPF2 shown in FIG. 3B, a redundant description will be omitted.

In addition, in the window FWM4, since the first protection layer LPF2 has the same structure as the first protection layer LPF2 shown in FIG. 3C, a redundant description will be omitted.

However, the second shock absorption layer UCF of the second protection layer UPF2 and the second shock absorption layer UCF of the second protection layer UPF2 are both formed on the thin film glass layer TG through a coating method.

Therefore, since the windows FWM3 and FWM4 have a shock absorption layer formed by a coating method, neither window includes the internal adhesive layer IAM (see FIGS. 8A and 8B) as compared with the windows FWM1 and FWM2 of FIGS. 8A and 8B. Therefore, the total thickness within a range of the windows FWM3 and FWM4 decreases by the thickness within a range of the internal adhesive layer IAM, as compared with the windows FWM1 and FWM2 of FIGS. 8A and 8B, respectively.

Therefore, when other conditions are the same, the bendability limit of the windows FWM3 and FWM4 may be reduced in comparison with the windows FWM1 and FWM2 of FIGS. 8A and 8B, respectively. For example, the bendability limit of the window FWM3 may be 2.0 mm and the bendability limit of the window FWM4 may be 2.5 mm.

Also, when the internal adhesive layer IAM is removed, even if the folding operation is repeated for a long time, there is no problem such as peeling of the internal adhesive layer in the folding area. For example, the phenomena such as delamination in the folding area, lifting phenomenon, and the like may be reduced.

FIGS. 10A to 10D are process diagrams showing a manufacturing process of the window shown in FIG. 8A.

Figure 10A:
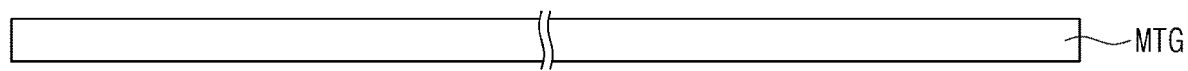
FIGS. 10A to 10D are process diagrams illustrating a manufacturing process of the window shown in FIG. 8A.

Referring to FIG. 10A, a window base material MTG may be prepared. The window base material MTG may contain glass. The glass material may include a silicate, and may further include various materials to increase durability, surface smoothness, and transparency. In an embodiment of the present inventive concept, the window base material MTG may further include an alkali metal, an alkaline earth metal, an oxide thereof, or the like.

Figure 10B:
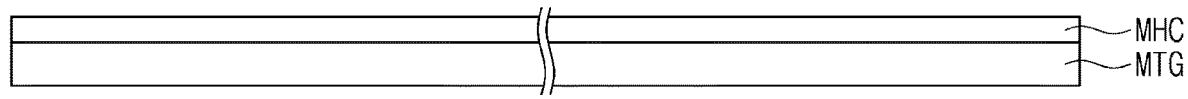

Referring to FIG. 10B, a hard coating material MHC may be formed on one side of the window base material MTG. The hard coating material MHC may include a urethane resin, an epoxy resin, an acrylic resin, and/or an acrylate resin. As one example of the present inventive concept, the hard coating material MHC may include an acrylate resin.

The hard coating material MHC may be formed on one side of the window base material MTG through a coating method. For example, a hard coating material MHC may be formed on one side of the window base material MTG using a method such as slot die coating, spin coating, and the like.

Figure 10C:
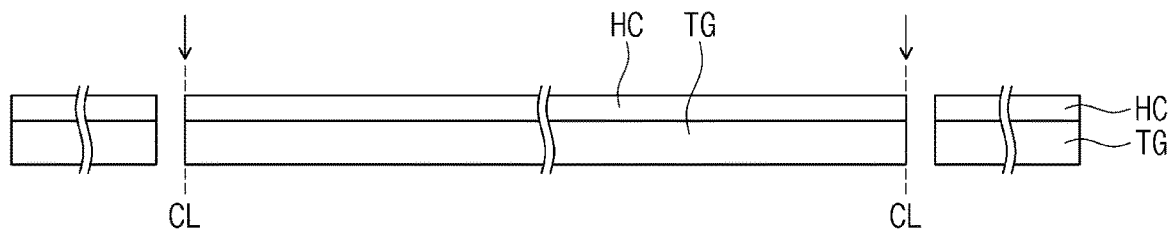

Referring to FIG. 10C, the window base material MTG coated with the hard base material MHC may be cut along a cutting line CL. The cutting line CL may be provided in the effective area unit defined in the window base material MTG. Accordingly, when the window base material MTG is cut, a preliminary window of a size corresponding to the window FWM1 of FIG. 8A may be formed. Thus, the preliminary window may include a thin film glass layer TG and a hard coating layer HC.

Figure 10D:
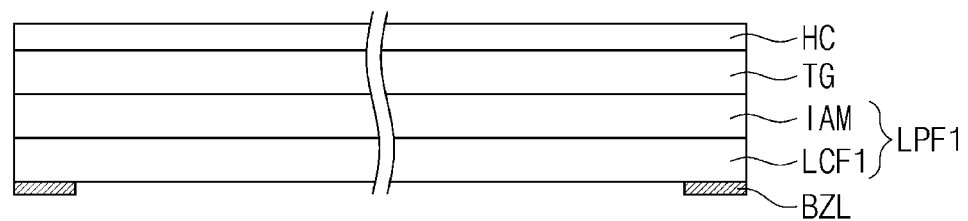

Referring to FIG. 10D, the first protection layer LPF1 may be formed on the rear surface of the thin film glass layer TG. The first protection layer LPF1 includes the first shock absorption layer LCF1 and the internal adhesive layer IAM. The bezel layer BZL may be formed on one side of the first shock absorption layer LCF1 by an inkjet printing method, an imprint method, a silk screen printing method, a lamination method, or the like. As an example of the present inventive concept, the bezel layer BZL may be formed on the rear surface of the first shock absorption layer LCF1.

The internal adhesive layer IAM is disposed between the thin film glass layer TG and the first shock absorption layer LCF1 to bond the shock absorption layer LCF1 and the thin film glass layer TG. The order of adhesion of the internal adhesive layer IAM, the first shock absorption layer LCF1, and the thin film glass layer TG is not particularly limited. After attaching the internal adhesive layer IAM to the thin film glass layer TG, the first shock absorption layer LCF1 may be attached to the internal adhesive layer IAM. In one embodiment of the present inventive concept, after attaching the internal adhesive layer IAM to the first shock absorption layer LCF1, the thin film glass layer TG may be attached.

Meanwhile, the first shock absorption layer LCF1 and the thin film glass layer TG may be attached simultaneously to the internal adhesive layer IAM.

Thereafter, a fingerprint prevention layer AF is formed on the hard coating layer HC to complete the window FWM1 of FIG. 8A. The fingerprint prevention layer AF may be formed by depositing or spraying a fingerprint-resistant material onto the upper surface of the hard coating layer HC.

FIGS. 11A to 11E are process diagrams showing a manufacturing process of the window shown in FIG. 8B.

Figure 11A:
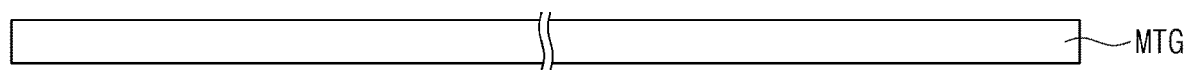
FIGS. 11A to 11E are process diagrams illustrating a manufacturing process of the window shown in FIG. 8B.
Figure 11B:
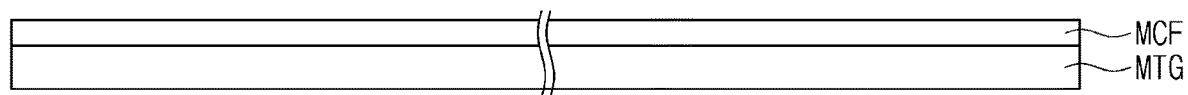

Referring to FIG. 11A, a window base material MTG may be prepared. The window base material MTG may contain glass.

Referring to FIG. 10B, a hard coating material MHC may be formed on one side of the window base material MTG. The impact absorbing material MCF may be formed on one side of the window base material MTG by a coating method. For example, the impact absorbing material MCF may be formed on one side of a window base material MTG using a slot die coating, a spin coating, or the like.

The impact absorbing material MCF may include a urethane resin, an epoxy resin, a polyimide resin, a polyamide resin, and/or an acrylate resin, which may be formed on the window base material MTG through a coating method. As one example of the present inventive concept, the impact absorbing material MCF may include polyimide PI and/or polyamide PAI.

As an example, when the impact absorbing material MCF is attached to the thin film glass layer TG through the adhesive layer without a coating method, the impact absorbing material MCF may include a polyimide resin, a polyamide resin, a polyester resin, a polyether resin, an acrylate resin, an acrylonitrile-butadiene-styrene (ABS) resin, and/or rubber (e.g. natural or synthetic).

Figure 11C:
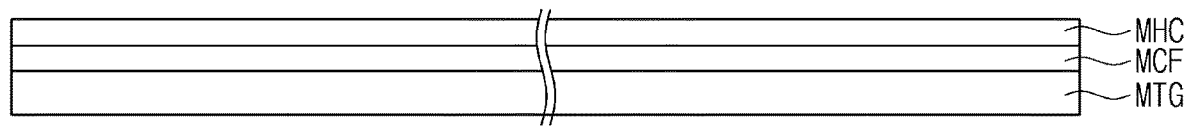

Referring to FIG. 11C, a hard coating material MHC may be formed on the impact absorbing material MCF. The hard coating material MHC may be made of an acrylic resin. The hard coating materials MHC may be formed on the impact absorbing material MCF through a coating process.

Figure 11D:
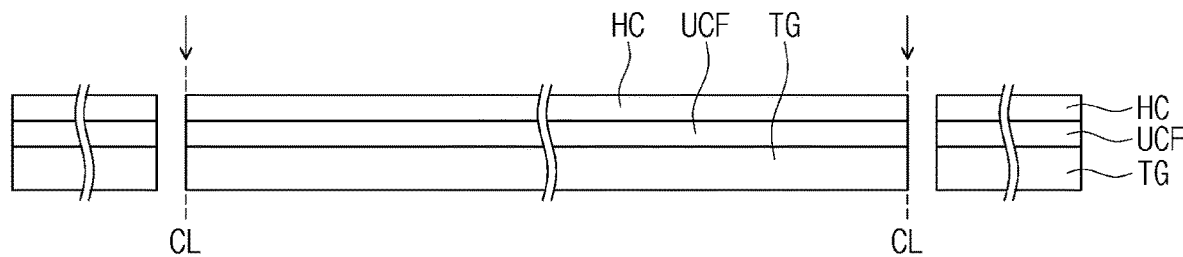

Referring to FIG. 11D, the window base material MTG coated with the impact absorbing material MCF, and the hard coating material MHC may be cut along a cutting line CL. The cutting line CL may be provided in the effective area unit defined in the window base material MTG. Accordingly, when the window base material MTG is cut, a preliminary window of a size corresponding to the window FWM2 of FIG. 8B may be formed. Thus, the preliminary window may include a thin film glass layer TG, a shock absorption layer UCF, and a hard coating layer HC.

Figure 11E:
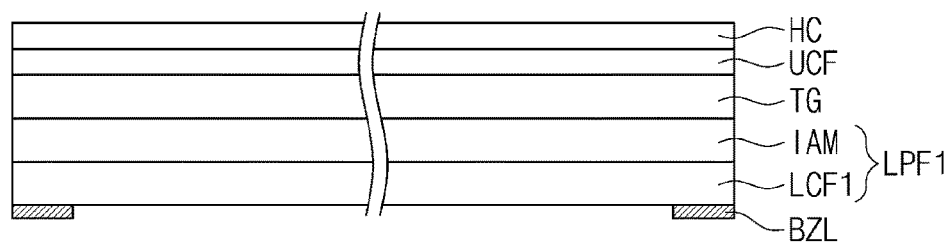

Referring to FIG. 11E, the first protection layer LPF1 and the bezel layer BZL may be formed on the rear surface of the thin film glass layer TG. The process of forming the first protection layer LPF1 and the bezel layer BZL is similar to that of FIG. 10D, so a detailed description thereof will be omitted.

Thereafter, a fingerprint prevention layer AF is formed on the hard coating layer HC to complete the window FWM2 of FIG. 8B.

Figure 12:
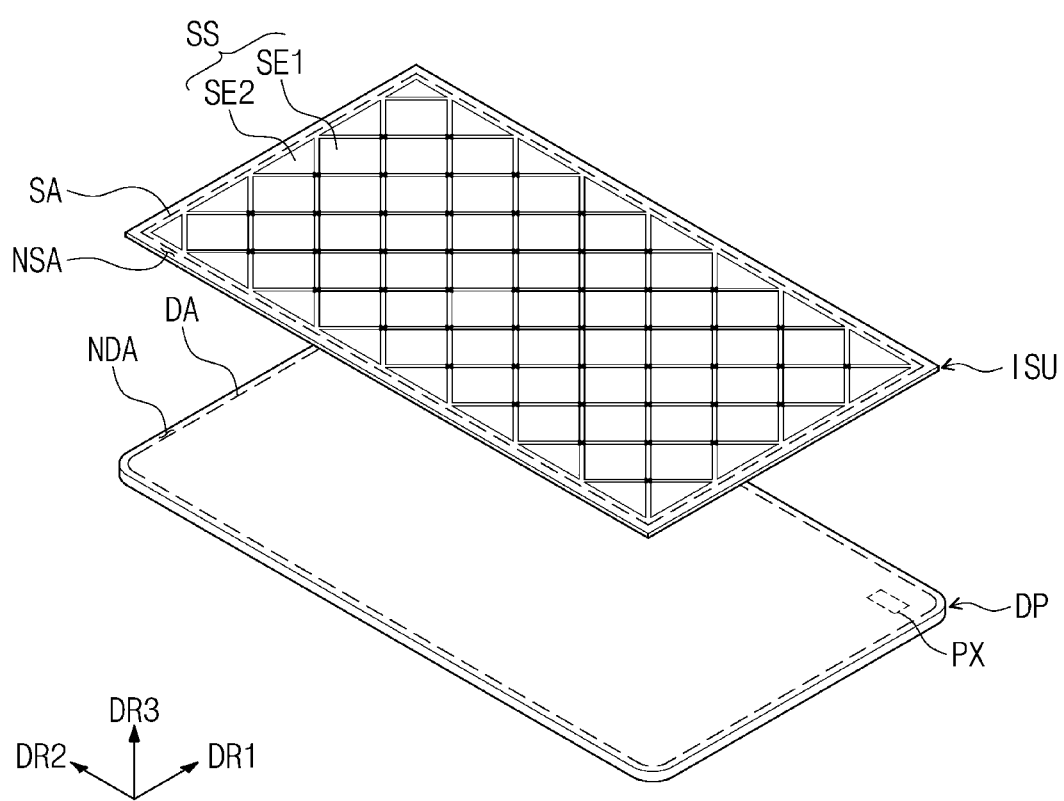
FIG. 12 is an exploded perspective view illustrating a display module according to an embodiment of the present inventive concept.
Figure 13:
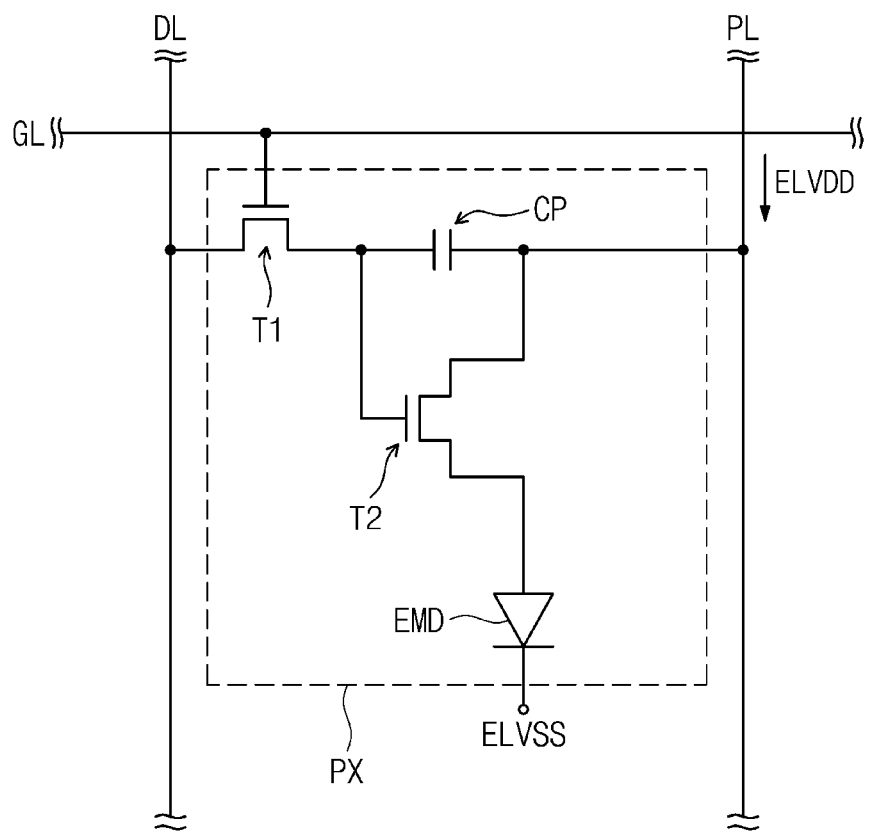
FIG. 13 is an equivalent circuit diagram illustrating a pixel included in a display panel according to an embodiment of the present inventive concept.
Figure 14:
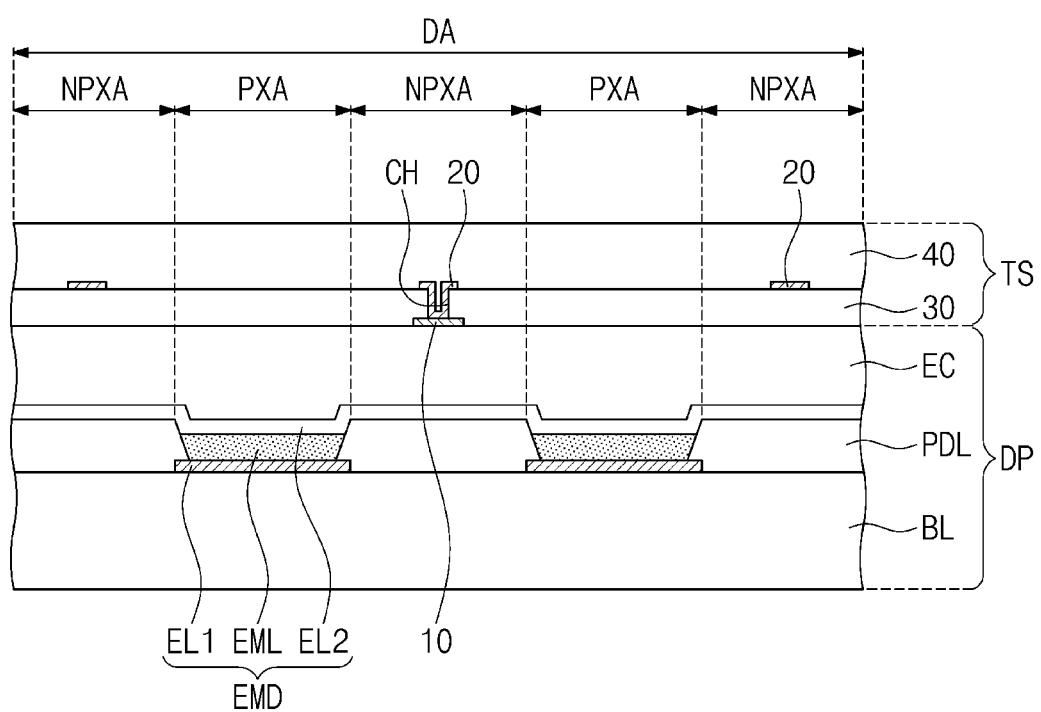
FIG. 14 is a cross-sectional view illustrating a part of the area of a display module according to an embodiment of the present inventive concept.

FIG. 12 is an exploded perspective view of a display module according to an embodiment of the present inventive concept. FIG. 13 is an equivalent circuit diagram of a pixel included in a display panel according to an embodiment of the present inventive concept. FIG. 14 is a cross-sectional view showing a part of the area of a display module according to an embodiment of the present inventive concept.

Referring to FIGS. 12 to 14, a display module DM according to an embodiment of the present inventive concept includes an input detection unit ISU and a display panel DP.

The input detection unit ISU may be disposed on the display panel DP. The input detection unit ISU detects the external input and obtains the position and intensity information of the external input. External input may be provided by various sources. For example, the external input may be applied by a part of the user's body (e.g. a finger), light, beat, or pressure. In addition, the input detection unit ISU may detect inputs that contact and also are close to or adjacent to the input detection unit ISU.

The input detection unit ISU may include a sensing area SA and a non-sensing area NSA. The sensing area SA may at least partially overlap the display area DA. The non-sensing area NSA is adjacent to the sensing area SA. The non-sensing area NSA may surround the edge of the sensing area SA on at least one side thereof. However, this is illustratively shown, and the non-sensing area NSA may be adjacent to only a portion of the edges of the sensing area SA, and is not limited to any one embodiment.

The sensing electrode SS is disposed in the sensing area SA. The sensing electrode SS may include a first sensing electrode SE1 and a second detection electrode SE2 that receive different electrical signals. The sensing electrode SS may obtain information on an external input TC (shown in FIG. 4) through a change in capacitance between the first sensing electrode SE1 and the second sensing electrode SE2.

The first sensing electrodes SE1 may be provided in plural and arranged so as to be spaced apart from each other along the second direction DR2. The plurality of first sensing electrodes SE1 may be electrically connected to each other. The second sensing electrodes SE2 may be provided in plural and arranged so as to be spaced apart from each other along the second direction DR2. The plurality of second sensing electrodes SE2 may be electrically connected to each other.

The touch sensor TS is disposed in a non-sensing area NSA, and may further include detection signal lines for transmitting an electrical signal provided from the outside to the first sensing electrode SE1, or providing a signal from the second sensing electrode SE2 to the outside.

The input detection unit ISU may be directly disposed on the display panel DP. For example, the sensing electrode SS or detection signal lines may be formed directly on the display panel DP. Alternatively, the touch sensor TS may be formed separately from the display panel DP, and then attached on the display panel DP through an adhesive member or the like. Alternatively, the touch sensor TS may be disposed on the rear surface of the display panel DP, or disposed within the display panel DP. The touch sensor TS, according to an embodiment of the present inventive concept, may be provided in various forms and is not limited to any one embodiment.

Referring to FIGS. 12 and 13, a plurality of pixels PX are provided in the display area DA of the display panel DP. The pixels PX implement an image IM (shown in FIG. 1) by displaying light according to an electrical signal.

As an example of the present inventive concept, each of the pixels PX may include a first thin film transistor T1, a second thin film transistor T2, a capacitor CP, and a light emitting element EMD. The first thin film transistor T1, the second thin film transistor T2, the capacitor CP, and the light emitting element EMD are electrically connected to each other.

The first thin film transistor T1 may be a switching element for controlling turn-on and turn-off of the each pixel PX. The first thin film transistor T1 is connected to the gate line GL and the data line DL. The first thin film transistor T1 is turned on by the gate signal provided through the gate line GL and provides a data signal provided through the data line DL to the capacitor CP.

The capacitor CP charges the voltage corresponding to the potential difference between the first power signal provided from the power line PL and the signal provided from the thin film transistor T1. The second thin film transistor T2 provides the light emitting element EMD with a first power signal provided from the power line PL in correspondence to the voltage charged in the capacitor CP.

The light emitting element EMD may generate light or control the amount of light according to an electrical signal. For example, the light emitting element EMD may include an organic light emitting element, a quantum dot light emitting element, an electrophoretic element, or an electrowetting element.

A light emitting element EMD is connected to a power terminal VSS and is provided with a power signal that is different from the power signal provided by the power line PL. In the light emitting element EMD, a driving current corresponding to the difference between the electric signal provided from the second thin film transistor T2 and the second power signal ELVSS flows, and the light emitting element EMD may generate light corresponding to the driving current.

The pixel PX may include electronic components having various configurations and arrangements, and is not limited to any one embodiment.

Referring to FIGS. 13 and 14, the display panel DP may include a base layer BL, a pixel defining layer PDL, a light emitting element EMD, and a sealing layer EC. The display panel DP may include a plurality of light emitting areas PXA and a plurality of non-light emitting areas NPXA arranged in a display area DA. FIG. 14 shows an area where two of the light emitting areas PXA are arranged.

The base layer BL may include a plurality of insulating layers and a plurality of conductive layers. The plurality of conductive layers and the plurality of insulating layers may together form a thin film transistor and a capacitor connected to the light emitting element EMD.

The pixel defining layer PDL is disposed on the base layer BL. In the pixel defining layer PDL, predetermined opening parts are defined. The opening parts may define light emitting areas PXA, respectively.

The light emitting element EMD is disposed on the base layer BL. The light emitting element EMD may be disposed at a position corresponding to each of the opening parts. The light emitting element EMD may produce an image by generating light according to an electrical signal transmitted through the thin film transistors T1 and T2 and the capacitor CP constituting the base layer BL.

In this embodiment, the light emitting element EMD may be an organic light emitting diode (OLED) element. The light emitting element EMD includes a first electrode EL1, a light emitting layer EML, and a second electrode EL2. The light emitting element EMD may generate light by activating the light emitting layer EML according to the potential difference between the first electrode EL1 and the second electrode EL2. Accordingly, the light emitting areas PXA may correspond to the areas where the light emitting layers EML are disposed.

The light emitting areas PXA may have different sizes. For example, each of the light emitting areas PXA may have a different size depending on the colors of the emitting light. By providing a light emitting area of an appropriate size for each of the different colors, it is possible to have a uniform light efficiency for various colors.

The sealing layer EC covers the light emitting element EMD. The sealing layer EC may include at least one inorganic film and/or organic film. The sealing layer EC prevents moisture penetration from the outside to the light emitting element EMD and protects the light emitting element EMD. In addition, a sealing layer EC may be disposed between the light emitting element EMD and the input detection unit ISU to electrically isolate the light emitting element EMD from the input detection unit ISU. However, this is illustratively shown, and the sealing layer EC may be provided as a glass substrate or a plastic substrate. An inert gas may be filled between the sealing layer EC and the light emitting element EMD. The display panel DP, according to an embodiment of the present inventive concept, may have various structures and is not limited to any one embodiment.

The input detection unit ISU may be disposed directly on the sealing layer EC. For example, the input detection unit ISU may be formed by depositing or patterning on the upper surface of the sealing layer EC. However, this is illustrated by way of example, and the display module DM may further include members such as color filters or buffer layers interposed between the input detection unit ISU and the sealing layer EC.

As shown in FIGS. 12 and 14, the input detection unit ISU may include a plurality of conductive layers and a plurality of insulating layers stacked on a cross-section. In this embodiment, the input detection unit ISU includes a first conductive layer 10, a second conductive layer 20, a first insulating layer 30, and a second insulating layer 40, which are disposed on different layers.

The first conductive layer 10 is disposed on the display panel DP. The second conductive layer 20 is disposed on the first conductive layer 10. The first sensing electrode SE1 and the second sensing electrode SE2 may be included in either the first conductive layer 10 or the second conductive layer 20. The first sensing electrode SE1 may be connected to the sensing signal lines to receive a touch detection signal. The second sensing electrode SE2 may be connected to the lead-out lines to output the detected signal.

Each of the first conductive layer 10 and the second conductive layer 20 includes a plurality of conductive patterns. The conductive patterns include the above-described first sensing electrode SE1 and second sensing electrode SE2.

The conductive patterns constituting each of the first conductive layer 10 and the second conductive layer 20 may be arranged so as not to overlap the light emitting areas PXA on a plane. Accordingly, although the first conductive layer 10 and the second conductive layer 20, according to an embodiment of the present inventive concept, may be formed of an opaque material or may have a large area, this might not adversely affect the image IM displayed on the light emitting areas PXA. However, this is illustratively shown. Each of the first conductive layer 10 and the second conductive layer 20 may include a conductive pattern disposed to overlap at least a part of the light emitting areas PXA, but are not limited to any one embodiment.

The first insulating layer 30 is disposed between the first conductive layer 10 and the second conductive layer 20. The first insulating layer 30 isolates and separates the first conductive layer 10 and the second conductive layer 20 from each other on a cross-section. Some of the first conductive layer 10 and the second conductive layer 20 may be electrically connected through a contact hole CH that penetrates the first insulating layer 30.

The second insulating layer 40 is disposed on the first insulating layer 30. The second insulating layer 40 may cover the second conductive layer 20. The second insulating layer 40 protects the second conductive layer 20 from the external environment.

The first insulating layer 30 and the second insulating layer 40 each have an electrically insulating property and may be optically transparent. Accordingly, even though the light emitting area PXA is covered by the first insulating layer 30 and the second insulating layer 40, light generated from the light emitting area PXA may be easily seen at the upper part of the input detection unit ISU.

The first insulating layer 30 and the second insulating layer 40 may include at least one inorganic film and/or organic film. For example, if the first insulating layer 30 and the second insulating layer 40 mainly include an organic film, the softness of the input detection unit ISU may be increased. Alternatively, for example, if the first insulating layer 30 and the second insulating layer 40 mainly include an inorganic film, a thin input detection unit ISU may be provided and an input detection unit ISU with increased impact resistance may be provided. The first insulating layer 30 and the second insulating layer 40, according to an embodiment of the present inventive concept, may include various materials and are not limited to any one embodiment.

According to an embodiment of the present inventive concept, in a window containing a thin film glass layer in the base layer, by providing a hard coating layer on the upper surface of the thin film glass layer, it is possible to prevent a phenomenon that fine cracks are generated in the thin film glass layer due to point impacts or surface impacts provided from the outside, and the shape deformation such as stamping and pressing occurs.

As a result, the impact resistance of the window and the display device employing the window may be increased.

Although the exemplary embodiments of the present inventive concept have been described, it is understood that the present inventive concept should not be limited to these exemplary embodiments but various changes and modifications may be made by one ordinary skilled in the art within the spirit and scope of the present disclosure.

What is claimed is:

1. A display device, comprising:
   a flexible display panel configured to display an image from a display surface thereof; and
   a window disposed on the display surface of the flexible display panel,
   wherein the window comprises:
   a first protection layer including a first shock absorption layer;
   a thin film glass layer disposed on the first protection layer; and
   a second protection layer, including a hard coating layer, disposed on the thin film glass layer,
   wherein the thin film glass layer is disposed between the first shock absorption layer and the hard coating layer.

2. The display device of claim 1, wherein the window further comprises an oleophobic coating disposed on the second protection layer.

3. The display device of claim 1, wherein the first protection layer further comprises an internal adhesive layer adhering the first shock absorption layer to the thin film glass layer.

4. The display device of claim 1, wherein the second protection layer further comprises
   a second shock absorption layer disposed between the hard coating layer and the thin film glass layer.

5. The display device of claim 1, wherein the thin film glass layer has a thickness within a range of 30 μm to 70 μm.

6. The display device of claim 1, wherein the flexible display panel comprises an organic light emitting diode (OLED) display panel including an organic light emitting element.

7. A display device, comprising:
- a display panel configured to display an image from a display surface thereof, the display panel including a folding area, in which the display panel is folded around a folding axis, and a plurality of non-folding areas adjacent to opposite sides of the folding area; and
- a window disposed on the display surface of the display panel,
- wherein the window comprises:
- a first protection layer including a first shock absorption layer;
- a thin film glass layer disposed on the first protection layer; and
- a second protection layer, including a hard coating layer, disposed on the thin film glass layer,
- wherein the thin film glass layer is disposed between the first shock absorption layer and the hard coating layer.

8. The display device of claim 7, wherein the display panel is configured to be folded out, such that the display surface is exposed to the outside, or folded in such that the display surface is covered.

9. The display device of claim 7, wherein the hard coating layer has a thickness within a range of 3 μm to 30 μm.

10. The display device of claim 7, wherein the hard coating layer comprises a urethane resin, an epoxy resin, an acrylic resin, and/or an acrylate resin.

11. The display device of claim 7, wherein the hard coating layer has an indentation hardness within a range of 15 HV to 40 HV.

12. The display device of claim 7, wherein the window further comprises an oleophobic coating disposed on the second protection layer.

13. The display device of claim 7, wherein the first shock absorption layer has a thickness within a range of 10 μm to 60 μm.

14. The display device of claim 7, wherein the first protection layer further comprises an internal adhesive layer adhering the first shock absorption layer to the rear surface of the thin film glass layer.

15. The display device of claim 14, wherein the internal adhesive layer has a thickness within a range of 10 μm to 70 μm.

16. The display device of claim 14, wherein the second protection layer further comprises
- a second shock absorption layer disposed between the thin film glass layer and the hard coating layer.

17. The display device of claim 16, wherein the second shock absorption layer has a thickness within a range of 5 μm to 50 μm.

18. The display device of claim 16, wherein the second shock absorption layer comprises a urethane resin, an epoxy resin, a polyimide resin, a polyamide resin, and/or an acrylate resin.

19. The display device of claim 7, wherein the display panel comprises an organic light emitting diode (OLED) display panel including an organic light emitting element.

20. A display device, comprising:
- a display panel configured to display an image from a display surface thereof, the display panel including a folding area, in which the display panel is folded around a folding axis, and a plurality of non-folding areas adjacent to opposite sides of the folding area; and
- a window disposed on the display surface of the display panel,
- wherein the window comprises:
- a thin film glass layer;
- a hard coating layer disposed on a front surface of the thin film glass layer;
- a first shock absorption layer disposed on a rear surface of the thin film glass layer;
- an internal adhesive layer disposed between the thin film glass layer and the fir shock absorption layer and adhering the first shock absorption layer to the rear surface of the thin film glass layer; and
- a second shock absorption layer disposed between the hard coating layer and the thin film glass layer.

* * * * *